US008186111B2

(12) United States Patent
Flaherty et al.

(10) Patent No.: US 8,186,111 B2
(45) Date of Patent: *May 29, 2012

(54) PROFILE ROOF TILE WITH INTEGRATED PHOTOVOLTAIC MODULE

(75) Inventors: Brian J. Flaherty, Alamo, CA (US); Timothy M. Davey, Newport Beach, CA (US)

(73) Assignee: Lumeta Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/329,376

(22) Filed: Dec. 5, 2008

(65) Prior Publication Data

US 2009/0077907 A1    Mar. 26, 2009

Related U.S. Application Data

(63) Continuation of application No. 11/770,694, filed on Jun. 28, 2007, now Pat. No. 7,506,477, which is a continuation-in-part of application No. 11/620,564, filed on Jan. 5, 2007, now Pat. No. 7,509,775.

(60) Provisional application No. 60/806,445, filed on Jun. 30, 2006, provisional application No. 60/806,528, filed on Jul. 3, 2006, provisional application No. 60/807,501, filed on Jul. 17, 2006, provisional application No. 60/820,334, filed on Jul. 25, 2006, provisional application No. 60/871,988, filed on Dec. 27, 2006, provisional application No. 60/940,432, filed on May 28, 2007.

(51) Int. Cl.
*E04D 13/18* (2006.01)
*H01L 31/042* (2006.01)

(52) U.S. Cl. ...................................... 52/173.3; 136/244

(58) Field of Classification Search ................. 52/173.3, 52/519, 539, 551, 555, 554, 748.1; 136/244, 136/251
See application file for complete search history.

(56) References Cited

U.S. PATENT DOCUMENTS

| 4,284,065 A | 8/1981 | Brill-Edwards |
| 4,382,435 A | 5/1983 | Brill-Edwards |
| 4,470,406 A | 9/1984 | Rinklake et al. |
| 4,594,470 A | 6/1986 | Headrick |

(Continued)

FOREIGN PATENT DOCUMENTS

DE    4408508 A1    9/1995

(Continued)

OTHER PUBLICATIONS

Transmittal, International Search Report, and Written Opinion of the International Searching Authority for International Application No. PCT/US2007/072590, Jan. 28, 2008, 9 pages total.

*Primary Examiner* — Robert Canfield
*Assistant Examiner* — Brent W Herring
(74) *Attorney, Agent, or Firm* — Katten Muchin Rosenman LLP

(57) ABSTRACT

A roofing module provides weather protection generates electrical power. The module comprises a base having a plurality of curved crests and curved pans. The crests and pans have contours sized and shaped to match the size and shape of the contours and pans of conventional clay or concrete S-tiles to enable the base to interlock with the conventional clay or concrete S-tiles. The base is made from lightweight plastic material. Each crest of the base includes a depressed portion. A photovoltaic panel is positioned in the depressed portions of at least two curved crests and span across at least one curved pan between the at least two curved crests.

20 Claims, 15 Drawing Sheets

U.S. PATENT DOCUMENTS

| | | | |
|---|---|---|---|
| D285,829 S | 9/1986 | Lock | |
| 4,636,577 A | 1/1987 | Peterpaul | |
| 4,830,038 A * | 5/1989 | Anderson et al. | 136/251 |
| 5,022,381 A | 6/1991 | Allegro | |
| 5,048,255 A | 9/1991 | Gonzales | |
| 5,060,444 A | 10/1991 | Paquette | |
| 5,131,200 A | 7/1992 | McKinnon | |
| 5,164,020 A | 11/1992 | Wagner et al. | |
| 5,228,925 A | 7/1993 | Nath et al. | |
| 5,478,402 A * | 12/1995 | Hanoka | 136/251 |
| 5,482,569 A | 1/1996 | Ihara et al. | |
| 5,651,226 A | 7/1997 | Archibald | |
| 5,660,646 A | 8/1997 | Kataoka et al. | |
| 5,733,382 A * | 3/1998 | Hanoka | 136/251 |
| 5,768,831 A | 6/1998 | Melchior | |
| 5,904,606 A * | 6/1999 | Zimmer et al. | 446/108 |
| 5,990,414 A | 11/1999 | Posnansky | |
| 6,044,602 A | 4/2000 | Canavan | |
| 6,201,179 B1 | 3/2001 | Dalacu | |
| 6,282,858 B1 | 9/2001 | Swick | |
| 6,365,824 B1 | 4/2002 | Nakazima et al. | |
| 6,453,629 B1 | 9/2002 | Nakazima et al. | |
| 6,489,552 B2 | 12/2002 | Yamawaki et al. | |
| 6,534,703 B2 | 3/2003 | Dinwoodie | |
| 6,541,693 B2 | 4/2003 | Takada et al. | |
| 7,012,188 B2 | 3/2006 | Erling | |
| 7,155,870 B2 | 1/2007 | Almy | |
| 7,320,774 B2 | 1/2008 | Simmons et al. | |
| D599,034 S | 8/2009 | Placer | |
| 2001/0034982 A1 | 11/2001 | Nagao et al. | |
| 2003/0154680 A1 | 8/2003 | Dinwoodie | |
| 2003/0177706 A1 | 9/2003 | Ullman | |
| 2004/0000334 A1 | 1/2004 | Ressler | |
| 2005/0103376 A1 * | 5/2005 | Matsushita et al. | 136/251 |
| 2005/0161074 A1 | 7/2005 | Garvison et al. | |
| 2005/0189013 A1 | 9/2005 | Hartley | |
| 2006/0032527 A1 | 2/2006 | Stevens et al. | |
| 2006/0042683 A1 * | 3/2006 | Gangemi | 136/252 |
| 2006/0225780 A1 | 10/2006 | Johnson et al. | |
| 2008/0035140 A1 | 2/2008 | Placer et al. | |
| 2008/0098672 A1 | 5/2008 | O'Hagin et al. | |
| 2008/0149163 A1 * | 6/2008 | Gangemi | 136/246 |
| 2008/0245405 A1 | 10/2008 | Garvison et al. | |
| 2008/0289679 A1 * | 11/2008 | Ressler | 136/244 |
| 2009/0044854 A1 | 2/2009 | Placer et al. | |
| 2009/0194098 A1 | 8/2009 | Placer | |

FOREIGN PATENT DOCUMENTS

| | | | |
|---|---|---|---|
| EP | 1 296 382 A1 | 3/2003 | |

* cited by examiner

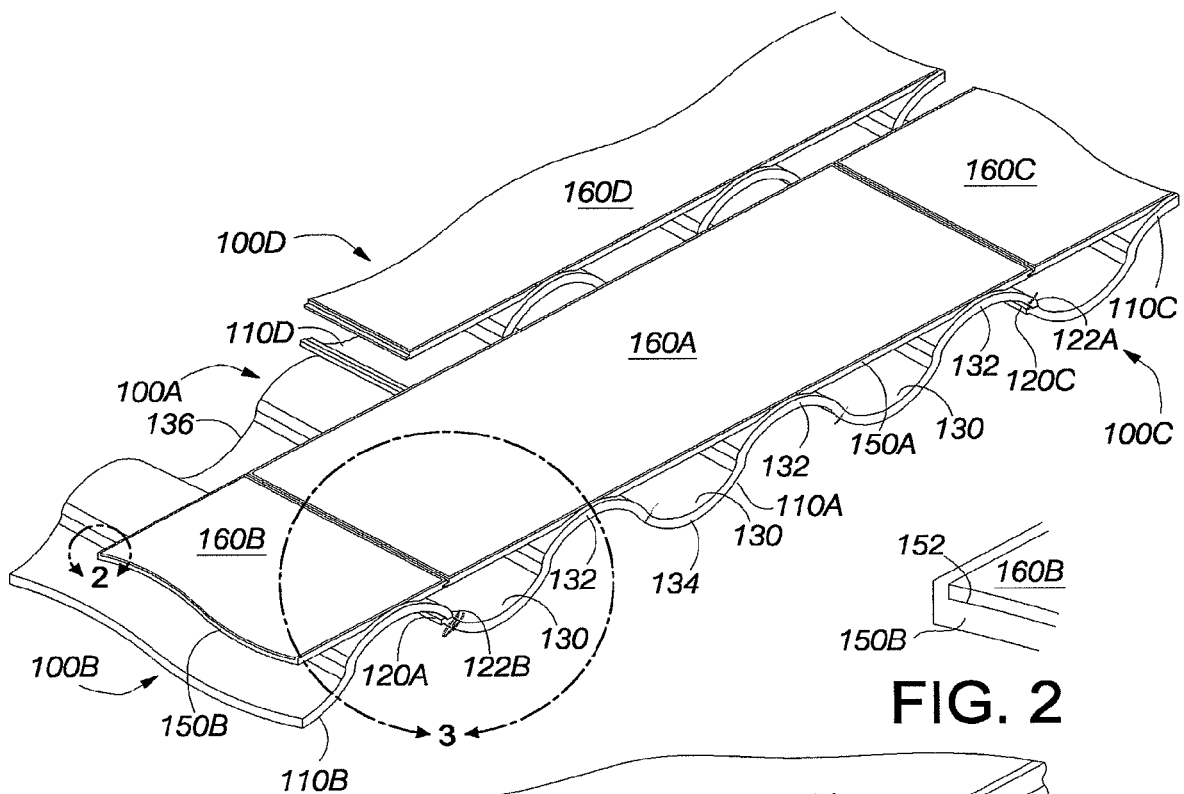
FIG. 1
FIG. 2
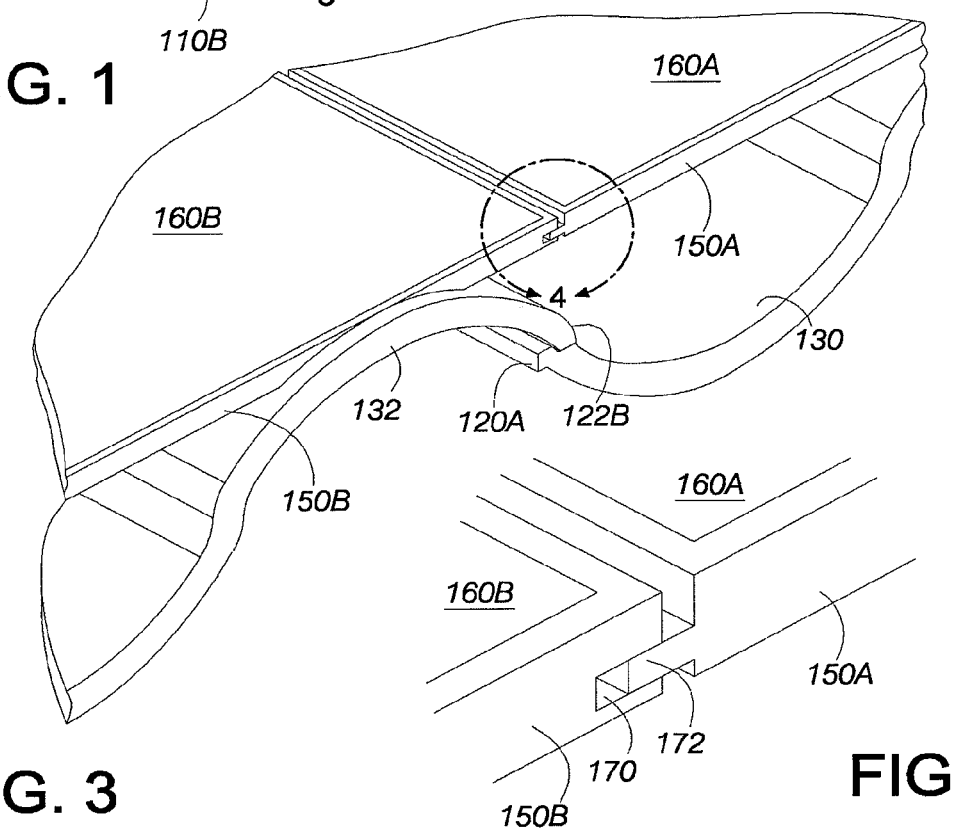
FIG. 3
FIG. 4

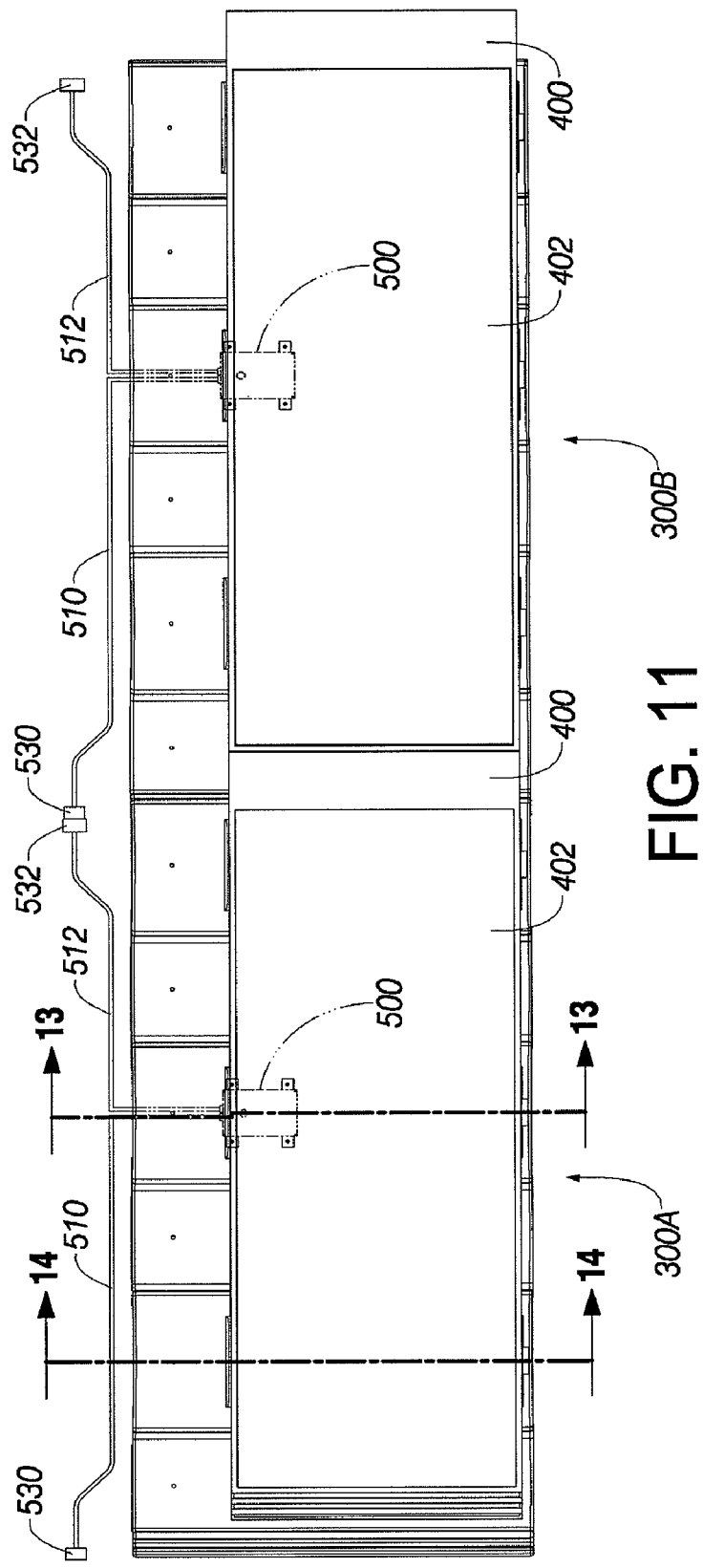
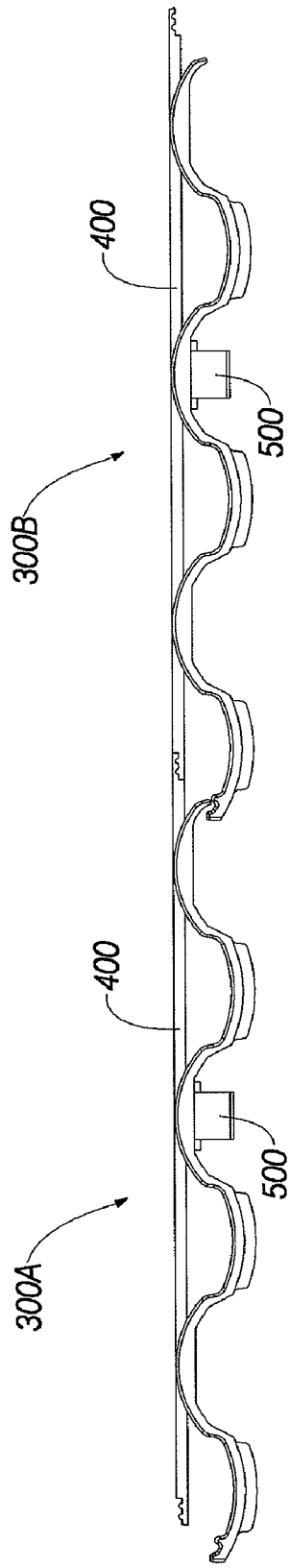
FIG. 11
FIG. 12

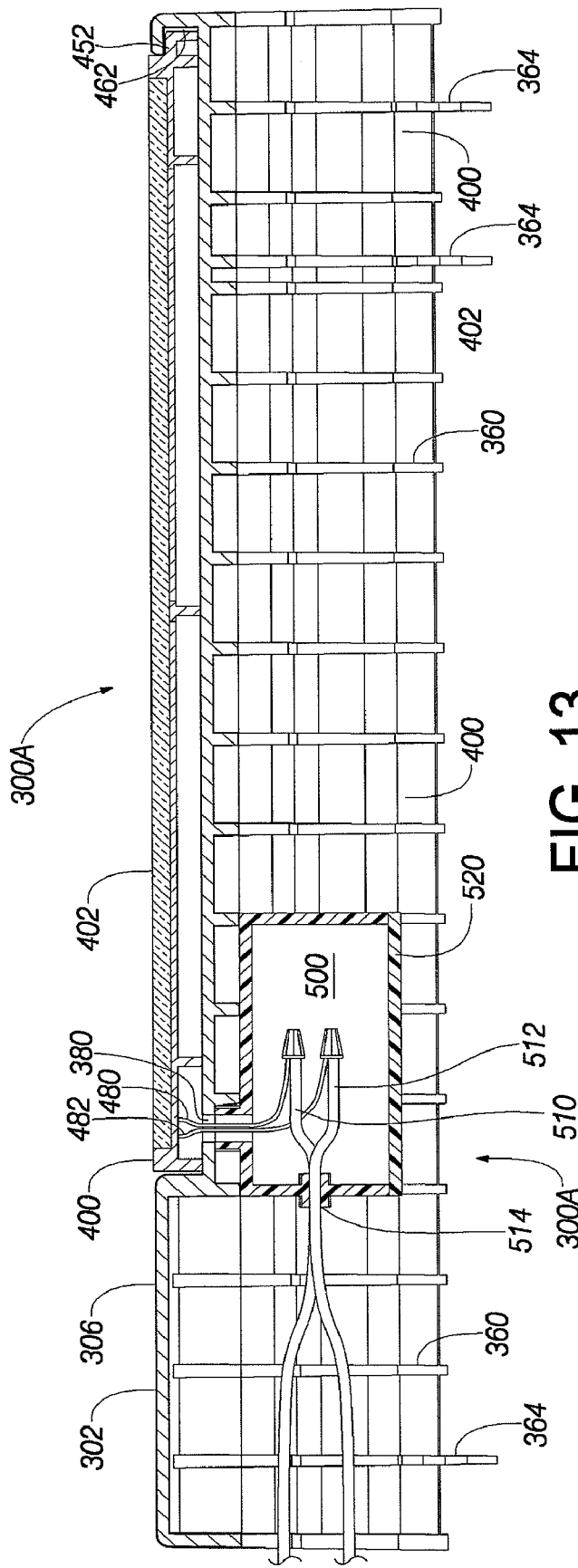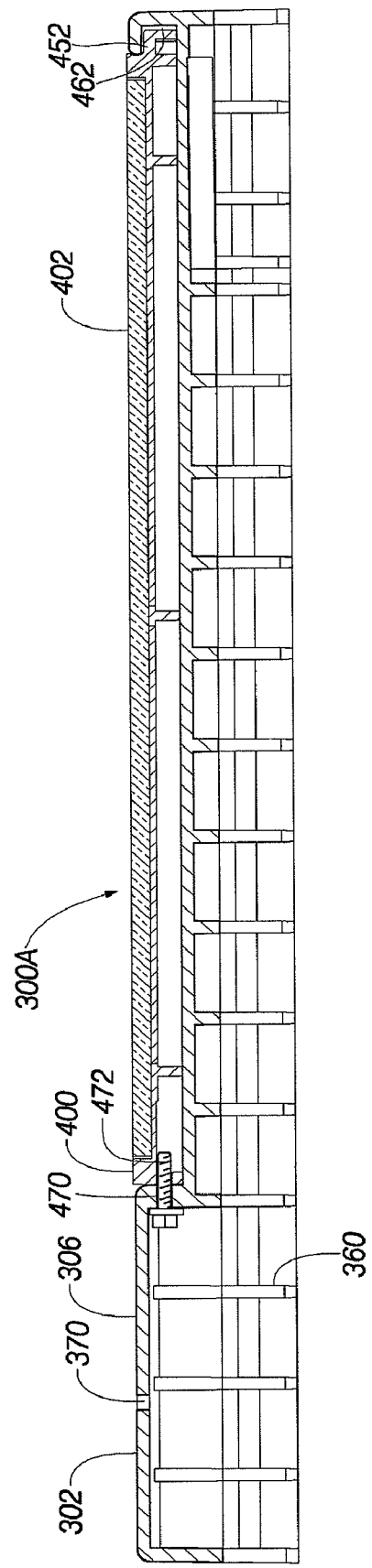

PROFILE ROOF TILE WITH INTEGRATED PHOTOVOLTAIC MODULE

RELATED APPLICATIONS

The present application is a continuation of U.S. patent application Ser. No. 11/770,694, filed Jun. 28, 2007 (now U.S. Pat. No. 7,506,477), which is continuation-in-part application of U.S. patent application Ser. No. 11/620,564, filed on Jan. 5, 2007 (now U.S. Pat. No. 7,509,775). The present application claims the benefit of priority under 35 U.S.C. §119(e) to the following provisional applications: U.S. Provisional Application No. 60/806,445, filed on Jun. 30, 2006; U.S. Provisional Application No. 60/806,528, filed on Jul. 3, 2006; U.S. Provisional Application No. 60/807,501, filed on Jul. 17, 2006; U.S. Provisional Application No. 60/820,334, filed on Jul. 25, 2006; U.S. Provisional Application No. 60/871,988, filed on Dec. 27, 2006; and U.S. Provisional Application No. 60/940,432, filed on May 28, 2007.

BACKGROUND OF THE INVENTION

1. Field of the Invention

The present invention relates to solar panels for generating electrical energy and more particularly relates to solar modules integrated into profile (contoured) roof tiles.

2. Description of the Related Art

Conventional solar panels for generating electrical power for residences are flat and are placed on a portion of the roof that faces the sun during midday. Originally, the solar panels were mounted over existing roofing materials (e.g., shingles) and formed a generally unaesthetic addition to a home. In some areas, the solar panels were not permitted because of the unattractive appearance. Recently developed solar panels are constructed in sizes and shapes that can be mounted directly to the underlying roof structure as replacements for flat roofing materials (e.g., flat concrete tiles) such that the solar panels provide the dual purpose of generating electrical power in response to sunlight and of providing protection from moisture intrusion while integrating in an aesthetically pleasing way with the roof system.

Because of the flat nature of conventional solar panels, such flat solar panels may be acceptable for roofs with flat roofing tiles as the primary roofing materials; however, when the flat solar panels are mounted on roofs that are otherwise protected with profile (e.g., contoured non-flat tiles), the flat areas occupied by the solar panels stand out visually. As used herein, profile tiles (e.g., non-flat or contoured tiles) refer to "S" tiles, low-profile tiles, and similar non-flat tiles that have a lower portion (e.g., a concave portion in an elevation view) and a higher portion (e.g., a convex portion in an elevation view) that form alternating crests and valleys, for example. Such tiles are also referred to as "profile" tiles to distinguish the tiles from conventional flat tiles. When such profile (contoured) tiles are installed on roofs, a lower portion of each succeeding vertical course of profile tiles overlaps an upper portion of the previous course with the elevated portions (e.g., crests) of the profile tiles in the higher row fitting over the elevated portions of the profile tiles in the lower row and with the valleys of the profile tiles in the higher course fitting into the valleys of the profile tiles of the lower course. Accordingly, the flat portions of the solar panels stand out in stark contrast to the surrounding profile tiles.

The flat solar panels create significant construction issues at the transitions between the profile tiles and the flat solar panels. In particular, the continuity in the water protection provided by the overlapping tiles is interrupted at each transition since the solar panels do not have contours that conform to the contours of the profile tiles in the next lower row.

SUMMARY OF THE INVENTION

The profile (contoured) solar panel tile described herein and illustrated in the attached drawings enables the electricity-generating solar panel to be included in a seamless application with any conventional profile tile because the solar panel is advantageously embodied in a shape and size of a conventional profile tile, such as, for example, a concrete or clay "S" tile, a concrete low-profile tile, or a profile tile constructed from other materials or in other shapes. As discussed herein, the size and shape of the profile solar panel tile may be adapted to the size and shape of profile tiles from a number of different manufacturers. The size and shape of the profile solar panel tile enables the same roofing mechanic who installs the conventional roofing tiles to install the profile solar panel tile without any special tools or fasteners. In particular, the profile solar panel tiles have crests and valleys that conform to the crests of valleys of conventional tiles in adjacent courses (e.g., conventional tiles above or below the profile solar panel tiles). The profile solar tiles also interlock with or overlap with adjacent conventional tiles when installed in the same course. The adjacent tiles may be other profile solar panel tiles or conventional profile roofing tiles.

BRIEF DESCRIPTION OF THE DRAWINGS

Certain aspects in accordance with embodiments of the present invention are described below in connection with the accompanying drawing figures in which:

FIG. 1 illustrates a perspective view of a first embodiment of a profile (contoured) solar panel tile and portions of adjacent profile solar panel tiles installed onto a roof in the place of conventional profile (contoured) tiles (e.g., "S" tiles);

FIG. 2 illustrates an enlarged perspective view of the area of the profile solar panel tile within the circle 2 of FIG. 1 to show the position of the solar module in the solar module support tray;

FIG. 3 illustrates an enlarged perspective view of the area of the profile solar panel tile within the circle 3 of FIG. 1 to show the junction of two profile solar panel tiles shown in FIG. 1;

FIG. 4 illustrates a further enlarged perspective view of the area of the junction of the two profile solar panel tiles within the circle 4 in FIG. 3 to show the interlocking of the ends of the solar modules of the two profile solar panel tiles;

FIG. 11 illustrates a top plan view of the two adjacent solar tile panels of FIG. 8;

FIG. 12 illustrates an elevational view of the two adjacent solar tile panels of FIG. 8;

FIG. 13 illustrates a cross-sectional view of the two adjacent solar tile panels of FIG. 8 taken along the lines 13-13 in FIG. 11;

FIG. 14 illustrates a cross-sectional view of the two adjacent solar tile panels of FIG. 8 taken along the lines 14-14 in FIG. 11;

DETAILED DESCRIPTION OF THE PREFERRED EMBODIMENTS

FIG. 1 illustrates a first profile (contoured) solar panel tile 100A in accordance with aspects of the present invention. FIG. 1 further illustrates a portion of a second profile solar panel tile 1 100B positioned at the left end of the first profile solar panel tile 100A and a portion of a third profile solar panel tile 100C positioned at the right end of the first profile solar panel tile 100A. As further illustrated in FIG. 1, a portion of a fourth profile solar panel tile 1 100D has a lower edge that overlaps the upper edges of portions of the first profile solar panel tile 1 100B and the third profile solar panel tile 100C.

Figure 5:
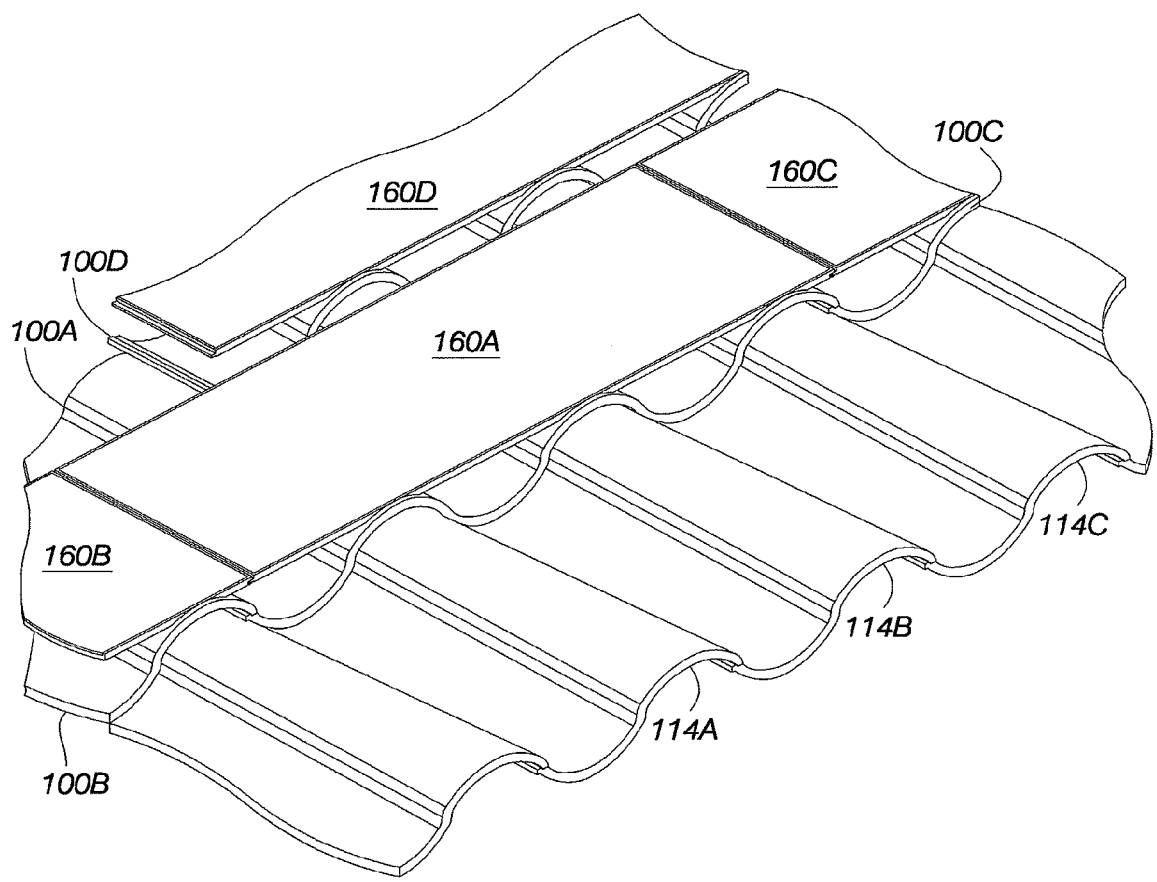
FIG. 5 illustrates the profile solar panel tiles of FIG. 1 in combination with conventional concrete "S" tiles.

In the embodiment illustrated in FIG. 1, the profile solar panel tile 100A comprises a profile structure 110A (also referred to herein as a tile base) that is sized and shaped to conform to the approximate size and shape of a plurality (e.g., three) of abutting conventional profile tiles ("S" tiles) 114A, 114B, 114C when positioned on the roof of a building (see FIG. 5). In particular, in the illustrated embodiment, the profile structure 110A has a first end 120A (at the left in FIG. 1) and a second end 122A (at the right in FIG. 1) that are spaced apart by a distance that corresponds to the lateral distance occupied by the width of the three conventional profile tiles 114A, 114B, 114C (see FIG. 5) when the conventional profile tiles are installed on a roof and are interlocked to provide a water tight connection between the profile tiles.

In the illustrated embodiment, the profile structure 110A has a width of approximately 35 inches, which corresponds to the total width of three 12-inch wide conventional profile tiles ("S" tiles) overlapped approximately 0.5 inch at each interlock. The profile structure 110A has a height (viewed in the direction of the slope of a roof on which the structure is installed) of approximately 17 inches, which corresponds to the height of the conventional profile 114A, 114B, and 114C in FIG. 5.

The profile structure 110A has a thickness (viewed normal to a roof on which the structure is installed) of approximately 3 inches, which corresponds to the thickness of the conventional profile tiles ("S" tiles) 114A, 114B, 114C, shown in FIG. 5.

The profile structure 110A comprises three concave valleys (low portions) 130 and three convex crests (high portions) 132 between the first end 120A and the second end 122A. The valleys and crests extend between a bottom edge 134 and a top edge 136 of the profile structure 110A. The widths of the crests 132 (e.g., the chords across the arc forming the crests) are tapered from the lower edge to the upper edge so that the lower edge of the crests of one profile structure can be positioned over the upper edge of the crests of another profile structure.

In the illustrated embodiment, the valleys 130 and the crests 132 of the profile structure 110A are formed to have the sizes and shapes of the corresponding valleys and crests of conventional profile tiles ("S" tiles). In particular, the sizes and shapes of the valleys and crests are selected so that the supporting structure 110A can be positioned in an overlapping relationship with conventional profile tiles. For example, one or more rows of the profile solar panel tiles described herein can be substituted in place of a corresponding number of rows of conventional profile tiles. The lowermost row of profile solar panel tiles overlaps a next lower row of conventional profile tiles. A next higher row of conventional profile tiles overlaps the upper row of profile solar panel tiles. The profile solar panel tiles and the conventional profile tiles have a headlap of approximately 3-4 inches to conform to the overlap of conventional rows of profile tiles.

Although shown with a particular size and shape in FIG. 1, it should be understood that the profile solar panel tile 100 can be configured in a size and shape to be compatible with the sizes and shapes of conventional profile tiles from many different manufacturers so that the profile solar panel tile 100 can be installed in courses above or below such conventional tiles. The profile solar panel tile 100 can also be installed in the same course as conventional tiles. For example, in the illustrated embodiment, the profile structure 110A has the approximate dimensions of three adjacent conventional tiles, such as, for example, three MNLT "S" tiles, three Eagle "S" tiles, three Hanson "S" tiles, three Westile "S" tiles, or three "S" tiles from other manufacturers, which allows a roofing mechanic to install the profile solar panel tiles 100 in an overlapped relationship with the conventional tiles while maintaining the aesthetic appearance of the roof. It should be understood that the profile solar panel tiles 100 can be configured with sizes and shapes that correspond to the sizes and shapes of a variety of conventional profile tiles from other manufacturers so that the contours of the profile solar panel tiles 100 conform to the contours of the conventional profile tiles. The conventional profile tiles may comprise concrete, clay, or other commercially available roofing materials. For example, the profile solar panel tiles 100 may be configured in the size and shape of low-profile contoured tiles (not shown) or in the size and shape of one-piece clay tiles, such as, for example, the configuration illustrated in FIG. 6 (discussed below).

As illustrated in FIG. 1, the first (left) end 120A of the first profile solar panel tile 100A is interlocked with the second (right) end 122B of the second profile solar panel tile 10B. The second (right) end 122A of the first profile solar panel tile 100A is interlocked with the first (left) end 120C of the third profile solar panel tile 100C. It should be understood that either end of the first profile solar panel tile 100A will also interlock with the opposing end of a conventional profile tile in a row of tiles comprising both conventional profile tiles and profile solar panel tiles.

In FIG. 1, a first portion of the fourth profile solar panel tile 100D is positioned over an uppermost portion of the first profile solar panel tile 100A, and a second portion of the fourth profile solar panel tile 100D is positioned over an uppermost portion of the third profile solar panel tile 100C to form a running bond wherein the interlocked ends of the tiles in one row are offset with respect to the interlocked ends of the tiles in an adjacent row. The profile solar panel tiles can also be installed in a straight bond pattern with the interlocked ends between adjacent tiles in one row aligned with the interlocked ends of adjacent tiles in an adjacent row (see FIG. 17 described below). In the illustrated embodiment, the tiles have approximately 3 inches of vertical headlap. The headlap may be increased up to 4 inches to allow the roofing mechanic to adjust the headlap so that the top row of tiles at the ridge of the roof comprises full tiles. In general, the profile solar panel tiles 100 can be installed in a similar manner to a conventional contour roofing tile (e.g., S-tile), which the profile solar panel tile is intended to replace.

The structure 110A of the profile solar panel tile 100A advantageously comprises a polyvinylchloride (PVC) plastic material or other suitable lightweight durable material. The PVC plastic material is manufactured to with a color that corresponds to the base color of a corresponding conventional "S" tile of concrete or clay so that the structure 110A of the profile solar panel tile blends with the conventional "S" tiles when installed on a roof with conventional "S" tiles.

As further illustrated in the drawings, a solar module support tray 150A extends across the tops of the crests 132 of the profile structure 110A. In particular, the solar module support tray 150A is embedded in the crests 132 so that an upper surface of the solar module support tray 150A is even with the peaks of the crests 132 (see, for example, the enlarged drawing in FIG. 3). The solar module support tray 150A has a lower edge that is displaced from the lower edge of the profile structure 110A by approximately 0.25 inch so that a portion of the crest 132 constrains the lower edge of the solar module support tray 150A. In FIG. 1, the solar module support tray 150A has a height of approximately 12.25 inches along the crests 132 and has a width of approximately 34.25 inches. For example, the width of the solar module support tray 150A is slightly less than the width of the profile structure 110A. The height and width of the solar module support tray 150A can be varied in accordance with the height and width of the profile structure 110A, which may be varied to correspond to the height and width of the three commercial tiles emulated by the profile structure 110A.

In the illustrated embodiment, the solar module support tray 150A has a thickness of approximately 0.375 inch so that at the peak of each crest 132, the solar module support tray 150A is embedded in the crest 132 by approximately 0.375 inch. The solar module support tray 150A advantageously comprises PVC plastic or other suitable material. In certain advantageous embodiments, the solar module support tray 150A comprises the same material as the profile structure 110A and is formed (e.g., injection molded) as part of the profile structure 110A.

The solar module support tray 150A is generally rectangular as shown. As shown in FIG. 2 for a solar module support tray 150B on the second profile solar panel tile 100B, a central portion of the solar module support tray 150B is depressed by approximately 0.1875 inch to form a cavity 152 having a depth of 0.1875 inch. The cavity 152 has a height of approximately 12 inches and a width of approximately 34 inches to receive a photovoltaic module (solar module) 160B having a generally corresponding height and width and having a thickness of approximately 0.1875 inch. The undepressed outer perimeter of the solar module support tray 150A forms a wall around the solar module 160A with a wall thickness of approximately 0.125 inch. The solar module 160A lies in the depressed cavity of the solar module support tray 150A with an exposed surface of the solar module 160A coplanar with the undepressed perimeter walls of the solar module support tray 150A. The solar module 160A is secured in the solar module support tray 150A by a suitable adhesive (not shown). The dimensions of the solar module support tray 150A and the dimensions of the solar module 160A can be varied to correspond to different sizes and shapes of conventional tiles that the profile solar panel tile 1 100A is intended to emulate.

The solar module support tray 150A receives a similar solar module 160A. Similar solar modules 160C and 160D are shown for the third profile solar panel tile 100C and the fourth profile solar panel tile 100D. Each solar module includes a pair of electrical conductors (not shown) that are routed through the bottom of the respective solar module support tray and through the crests of the underlying profile structure. The openings through the material of the solar module support tray and the profile structure are sealed with a waterproof material. The electrical conductors from the solar modules and a plurality of other solar modules are interconnected in a conventional manner to communicate the electrical power from the solar modules to a combiner box (not shown). For example, a plurality of solar modules are interconnected to provide a desired voltage. The voltages from a set of interconnected solar modules and a plurality of additional sets of interconnected solar modules are combined in a known manner to provide a source of electrical power.

Preferably, the left end of the solar module support tray 150A and the right end of the solar module support tray 150B are interlocked. One interlocking system is illustrated in FIGS. 3 and 4, wherein the right end of the solar module support tray 150B includes a groove 170 formed therein, and the left end of the solar module support tray 150A includes a corresponding tongue 172. When adjacent profile structures 110 are positioned on a roof, the tongue 172 of a right profile structure 110 is positioned in the groove 170 of a left profile structure 110 to assist in maintaining adjacent solar module support trays 150 in coplanar relationship. A more preferred interlocking system is illustrated below in connection with an embodiment shown in FIGS. 7-17

Aesthetically, the profile solar panel tile shown in the accompanying drawings is unlike anything else on the market. In particular, the profile solar panel tile is advantageously constructed with shapes, sizes and colors to correspond to the shapes sizes and colors of existing concrete or clay "S" tiles or tiles with other distinct contours. In contrast, the "flat" profile solar panels that are currently on the market tie into the conventional "S" profile tiles with a combination of pan and cover metal flashings to keep the water off the underlayment. Unlike, conventional "flat" profile solar panels, no special flashings are required for the profile solar panel tiles to make the completed roof water tight because the profile solar panel tiles overlap with the conventional concrete "S" tiles in a manner similar to the manner in which rows of conventional "S" tiles overlap.

From the ground looking up at the roof, the profiles of the contoured solar panel tiles look substantially the same as if there were no solar tiles on the roof. Other products that are currently on the market create a flat depression in the field of the roof that is about 3 inches deep, which interrupts the profile of the roof system and is aesthetically unpleasing.

Embedding the solar module into the top portion of the profile solar panel tile helps hide the solar module behind the contoured profile of the conventional concrete or clay profile tiles on lower rows of tiles when looking up at the roof from the ground. At the same time, the embedded solar modules at the crests of the profile solar panel tiles still allow water to flow down the "pans" (e.g., the valleys) of the profile solar panel tiles uninterrupted, as illustrated by the continuous valleys shown in FIG. 5.

As discussed above, the solar module can also be incorporated into a plastic tile or a tile comprising another lightweight material configured to have the size, shape and appearance of a plurality (e.g., three) low-profile "Mediterranean" style tiles having a shallower water channel. In particular, one profile solar panel tile in accordance with the present invention fits in the space that would be occupied by two or more (e.g., three) low-profile tiles such as, for example, the single conventional low-profile tile (not shown). Accordingly, the low-profile solar panel tile overlaps with the conventional concrete low-profile roof tiles and maintains the continuity of the crests and valleys to maintain the overall visual impression of the conventional tiles.

Figure 6:
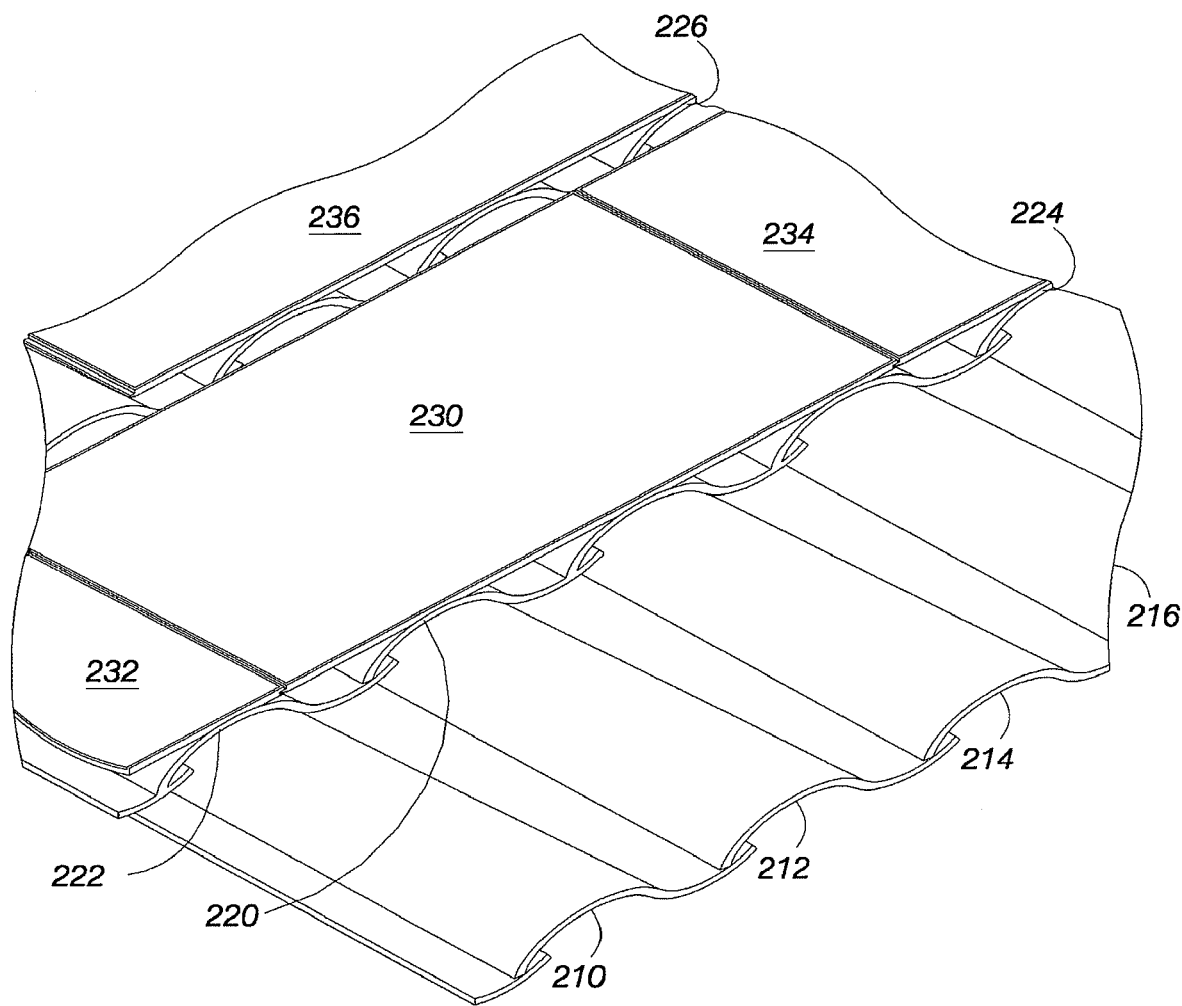
FIG. 6 illustrates a profile tile solar panel configured with a contoured shape and a size to replace a plurality (e.g., three) of conventional clay "S" tiles.
Figure 7:
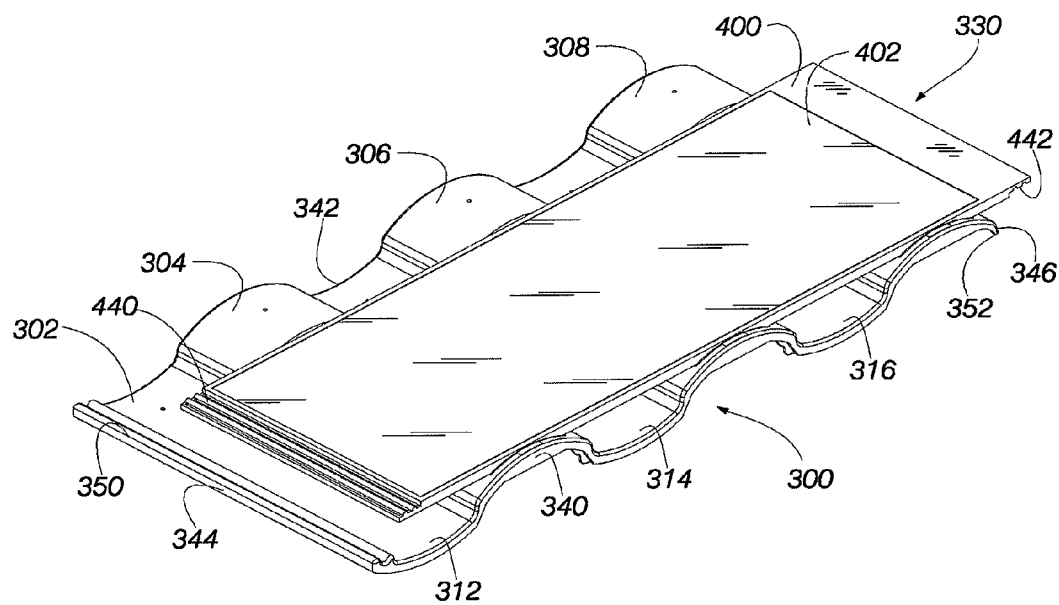
FIG. 7 illustrates a perspective view of a second embodiment of a profile solar panel tile configured for injection molding.

The solar module may also be incorporated into other structures having a profile that emulates the appearance of other conventional concrete or clay roofing tiles. For example, FIG. 6 illustrates a portion of a roof having a plurality of conventional one-piece clay tiles 210, 212, 214, 216 in a first course of tiles. A first profile solar panel tile 220, a second profile solar panel tile 222, and a third profile solar panel tile 224 in a second course overlap with respect to the conventional tiles in the first course to form a headlap of substantially the same length as the headlap formed between adjacent courses of conventional tiles. A fourth profile solar panel tile 226 in an third course of tiles overlaps with the two profile solar panel tiles in the second course to form a headlap between the two courses. The profile solar panel tiles 220, 222, 224, 226 include respective solar modules 230, 232, 234, 236 across the crests. Preferably, the height and width of each solar module is selected to cover a substantial portion of the exposed crests of the respective profile solar panel tiles. As illustrated, the first profile solar panel tile 220 has a width corresponding to the width of three conventional one-piece clay tiles (e.g., the tiles 212, 214, 216 in the first course).

Figure 8:
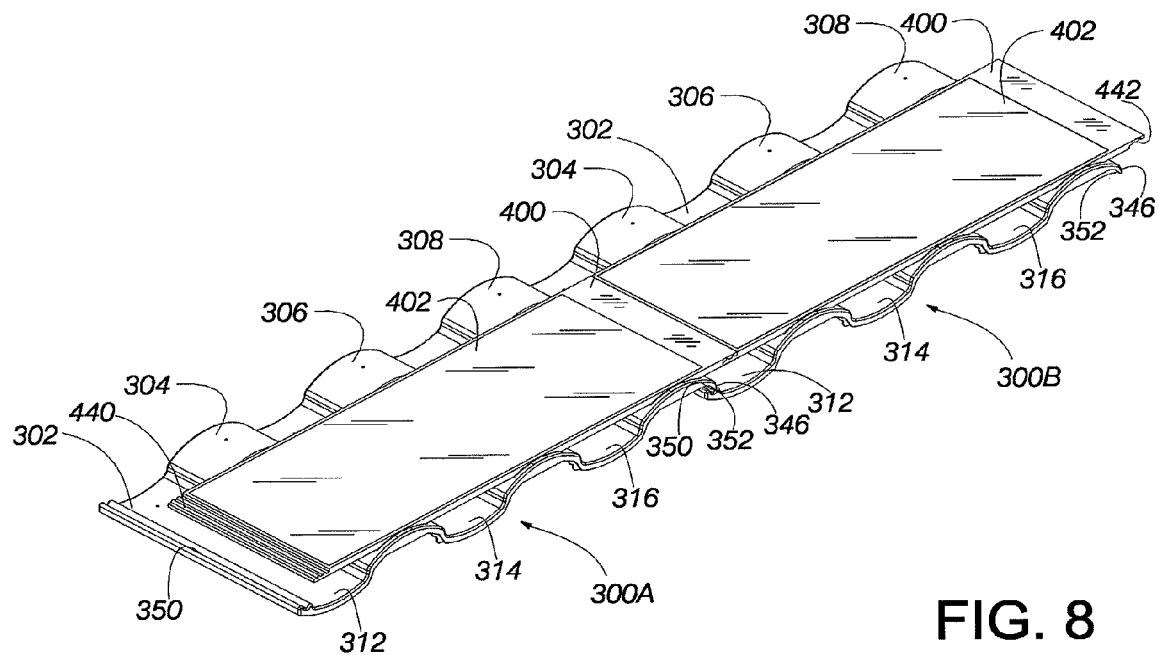
FIG. 8 illustrates a perspective view of two solar panel tiles in accordance with the second embodiment in FIG. 7 positioned with the panel bases and the panel support frames interlocked.
Figure 9:
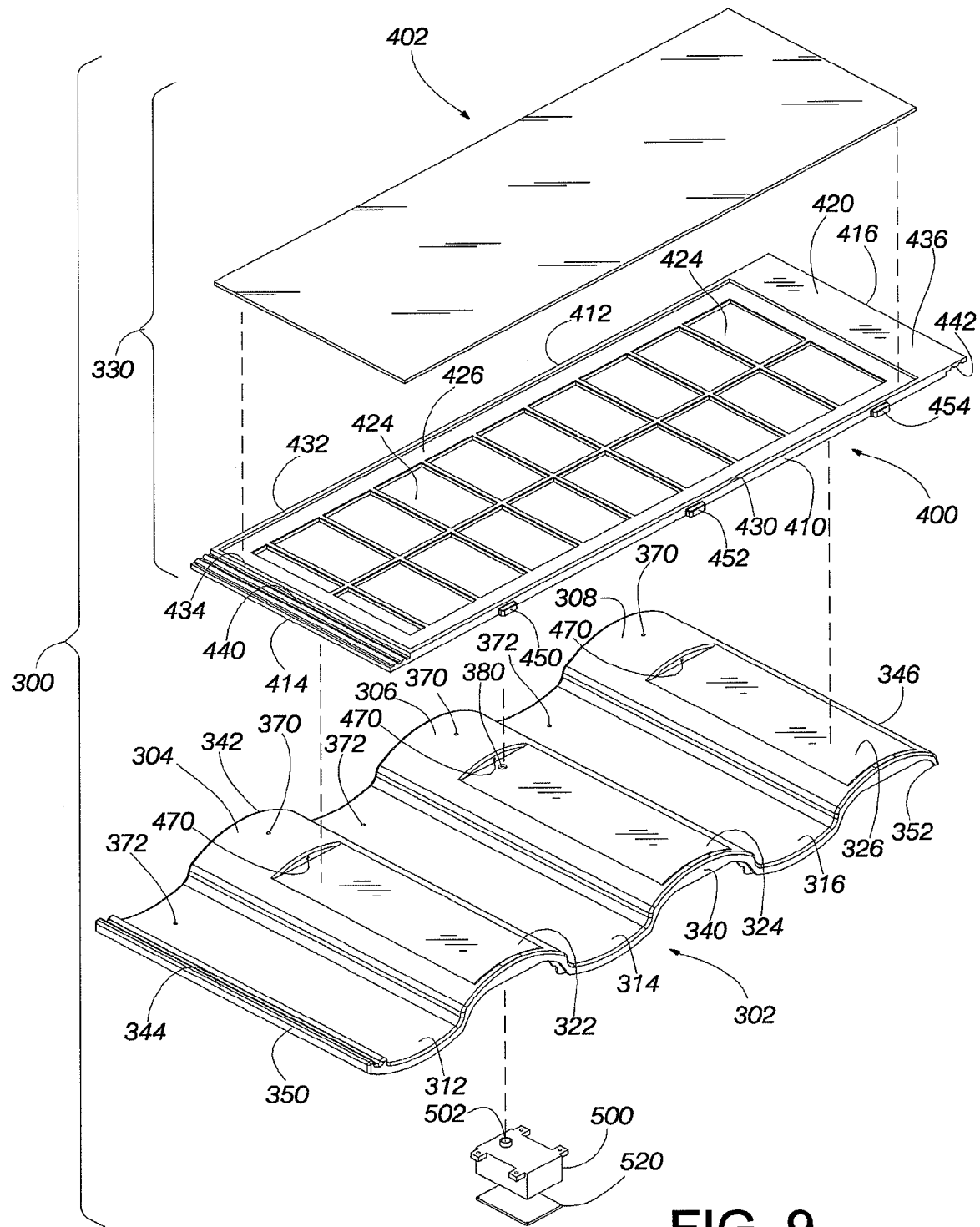
FIG. 9 illustrates an exploded perspective view of the profile solar panel tile of FIG. 7 looking from the top of the assembly showing the panel base, the panel support frame, the photovoltaic panel and the wiring junction box.

FIGS. 7-15 illustrate a more detailed embodiment of a profile solar panel tile 300 in accordance with an embodiment suitable for production using injection molding techniques. As illustrated in the top view in FIG. 7, the solar panel tile 300 comprises an S-tile roofing panel base 302. The panel base 302 comprises a plurality of crests 304, 306, 308 and pans 312, 314, 316 as described above for the other embodiments. As shown in FIG. 9, the crests 304, 306, 308 have respective depressed, flat areas 322, 324, 326, which are positioned to receive a solar cell array panel assembly 330. The depressed areas 322, 324, 326 are depressed by approximately 0.45-0.5 inch from the tops of the respective crests 304, 306, 308.

In the preferred embodiment, the panel base 302 of each solar panel tile has a height from a lower edge 340 to an upper edge 342 of approximately 17 inches and has a width from a left side 344 to a right side 346 of approximately 35.5-36 inches. The panel base 302 has a height of approximately 3.4-3.5 inches.

Each panel base 302 has a left interlock 350 and a right interlock 352. As shown in FIG. 8, when a first (left) solar panel tile 300A and a second (right) solar panel tile 300B are positioned side-by-side, the right interlock 352 of the panel base 302 of the left solar panel tile 300A receives the left interlock 350 of the panel base 302 of the right solar panel tile 300B, which causes the panel bases 302 of the two solar panel tiles 300A, 300B to overlap by approximately 0.8-0.85 inch. Because of the overlap of the interlocks 350, 352, each solar panel tile 300A, 300B has an effective width of approximately 34.65-35.2 inches when the respective panel bases 302 are interlocked as shown in FIG. 8.

As shown in FIG. 9, the depressed areas 322, 324, 326 are offset with respect to the upper edge 342 of the panel base 302 by approximately 4.1-4.15 inches and are offset from the lower edge 340 by approximately 0.45-0.5 inch such that the depressed, flat areas have a length of approximately 12.35-12.45 inches to receive the solar panel assembly 330. As illustrated, both the lower edge 340 and the upper edge 342 retain the contour of the S-tile.

Figure 10:
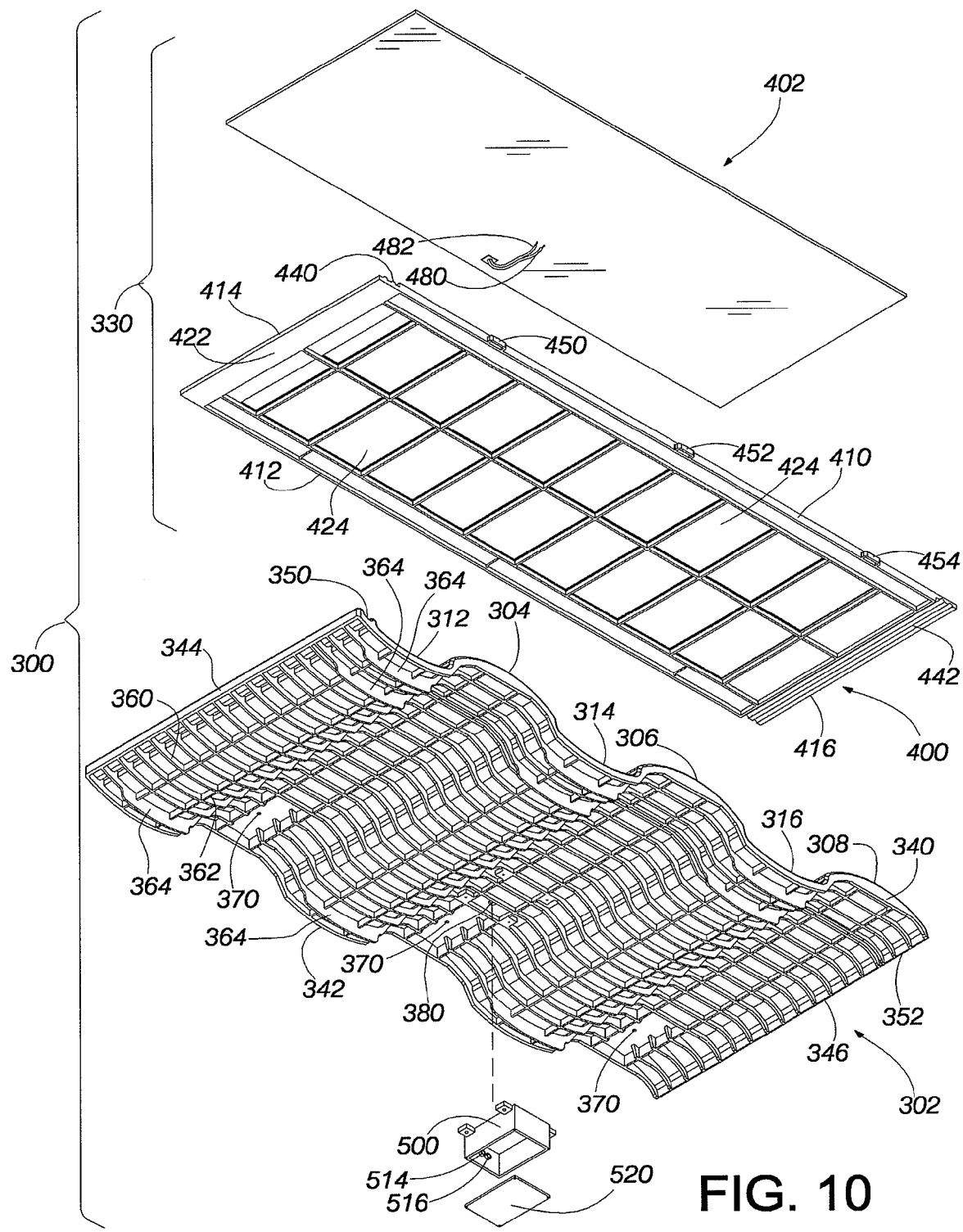
FIG. 10 illustrates an exploded perspective view of the profile solar panel tile of FIG. 7 looking from the bottom of the assembly.
Figure 15:
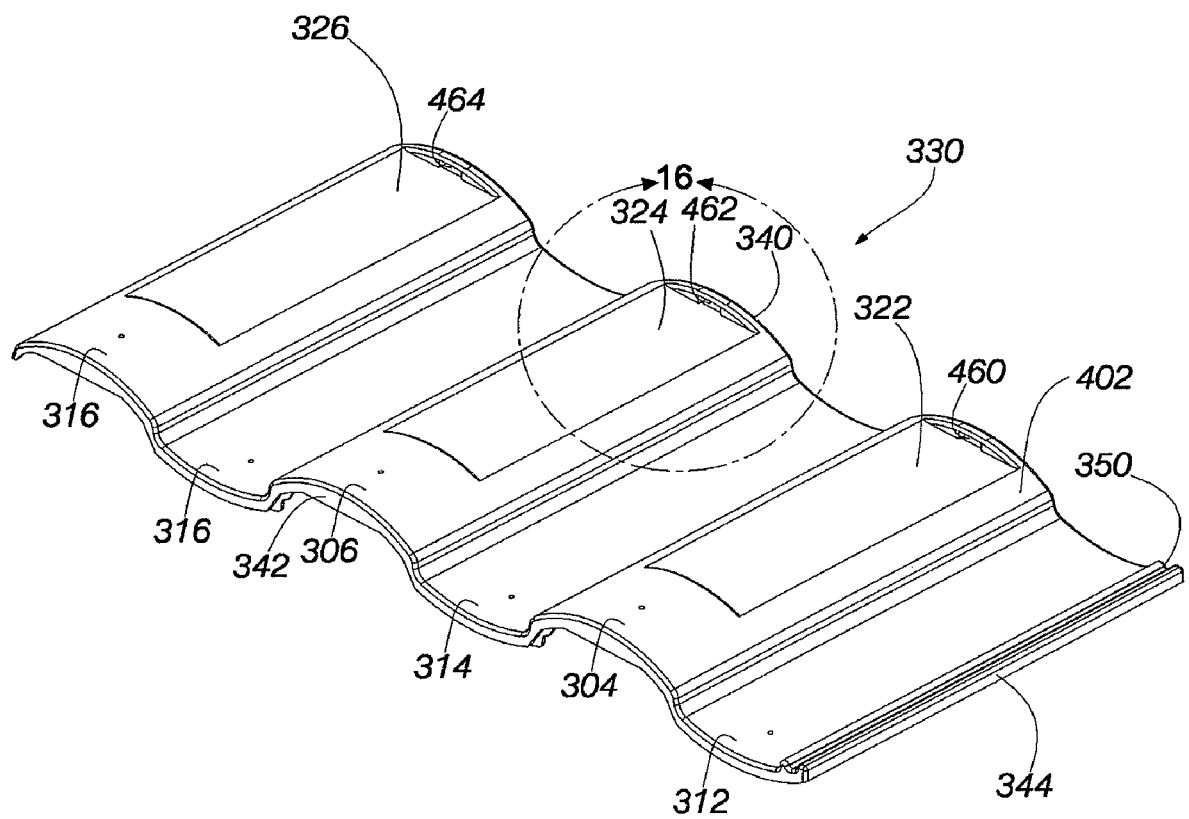
FIG. 15 illustrates a perspective view of the solar tile panel base of FIG. 9 rotated to show the openings in the crests to receive the protrusions of the solar panel support frame.

As shown in the bottom view in FIG. 10, the panel base 302 of the profile solar panel tile 300 includes a plurality of horizontal strengthening ribs 360 and vertical strengthening ribs 362. The ribs 360, 362 provide sufficient strength to allow the panel base 302 to be constructed from relatively thin plastic material (e.g., approximately 0.125 inch in thickness).

As further shown in FIG. 10, the panel base 302 further comprises a plurality of spacer ribs 364 (e.g., six spacer ribs 364) which correspond to the spacer ribs on conventional clay or concrete S-tiles so that the solar panel S-tile maintains a substantially similar vertical position with respect to conventional tiles when installed on the same roof. For example, each spacer rib 364 has a height of approximately 0.5 inch, which is included in the overall height of 3.4-3.45 inches set forth above.

Figure 17:
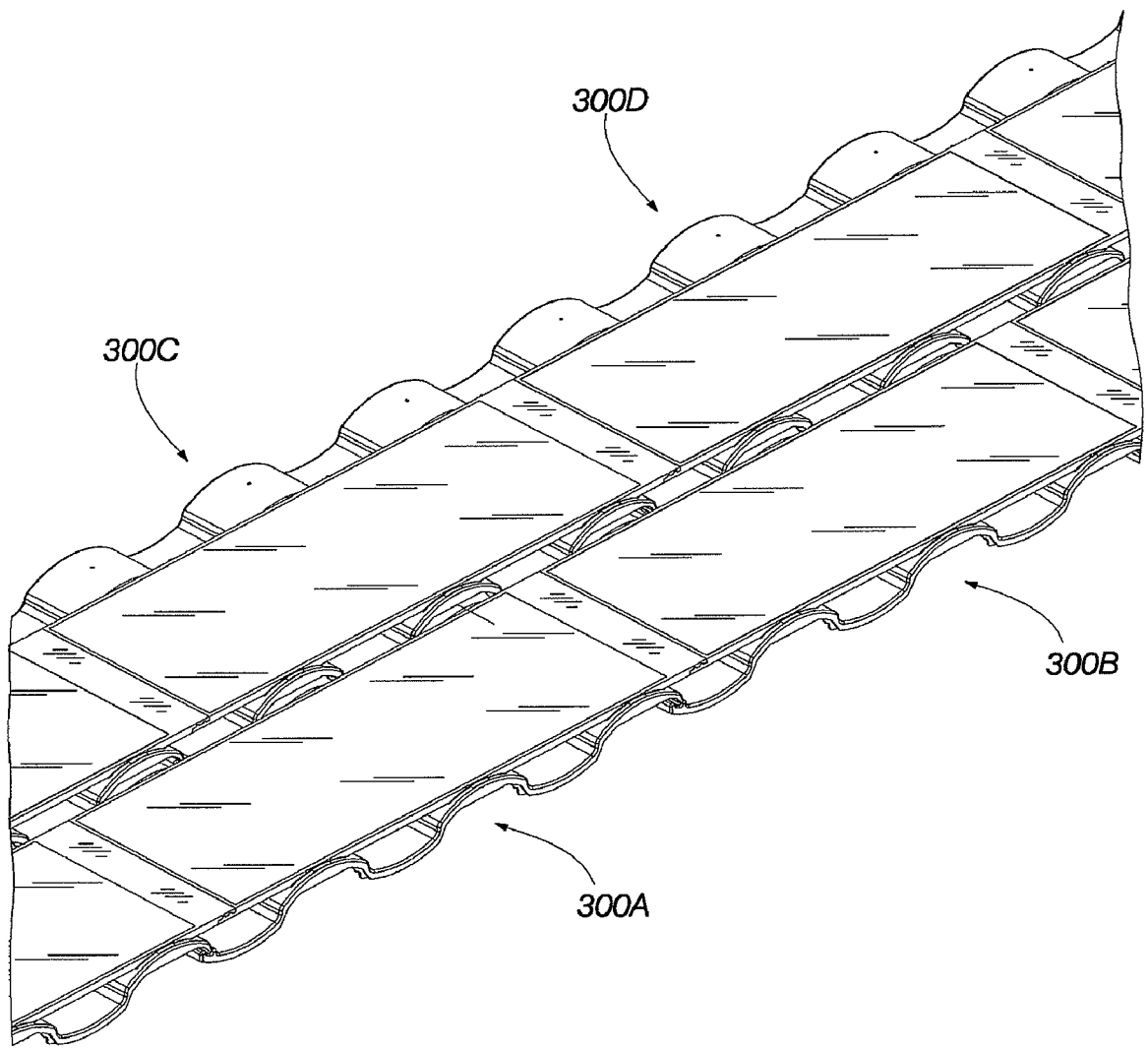
FIG. 17 illustrates two rows of solar tile panels in accordance with the second embodiment of FIG. 7 with the lower portions of the solar tile panels in the upper row overlapping the upper portion of the solar tile panels in the lower row.

As shown in FIG. 9 for the illustrated embodiment, the panel base 302 further includes at least one vertically disposed fastener hole 370 in each crest 304, 306, 308 and at least one vertically disposed fastener hole 372 in each pan 312, 314, 316 proximate the upper edge 342 to receive a nail, screw, or other fastener to secure the panel base 302 to a roof (not shown). When the panel bases 302 are installed on a roof, the fastener holes 370, 372 are covered with overlapping portions of one or more tiles in a next higher row of tiles (either solar tiles as described herein or conventional tiles), as illustrated in FIG. 17.

As further shown in FIG. 9, the middle crest 306 further includes an opening 380 formed in the middle depressed area 324 proximate to the upper boundary of the depressed area 324. The opening 380 extends through the body of the panel base 302. The opening 380 can also be formed in either of the other depressed areas 322, 326.

As shown in the exploded view in FIG. 9, the solar array panel assembly 330 comprises a panel support frame 400 and a photovoltaic (solar cell array) panel 402. The panel support frame 400 is rectangular and has a height sized to fit in the depressed areas 322, 324, 326 and a width selected to be approximately equal to the width of the panel base 302.

Accordingly, the panel support frame 400 has a height between a lower edge 410 and an upper edge 412 that is slightly less than approximately 12.35-12.45 inches and has a width between a left edge 414 and a right edge 416 of approximately 35.5-36 inches. The panel support frame 400 has a thickness of approximately 0.45-0.5 inch between a top 420 and a bottom 422, which generally corresponds to the depth of the depressed areas 322, 324, 326 so that the top 422 of the panel support frame 400 is approximately flush with the tops of the crests 304, 306, 308, or slightly below or above the tops of the crests. The bottom 422 rests on the depressed areas 322, 324, 326. The bottom 422 includes a plurality of openings 424 that reduce the amount of material required to form the panel support frame 400.

The top 420 of the frame 400 has a depressed central portion 426 that is generally rectangular in shape. The depressed central portion 426 is sized to form a rectangular rim having a lower wall 430 with a thicknesses of approximately 0.25 inch proximate the lower edge 410, having an upper wall 432 with a thicknesses of approximately 0.25 inch proximate the upper edge 412, having a left wall 434 with a thickness of approximately 1.5 inches proximate the left edge 414, and having a right wall 436 with a thickness of approximately 2.7 inches proximate the right edge 416. As illustrated, an upper portion of the left wall 434 is removed to form a left interlocking toothed portion 440, and a lower portion of the right wall 436 is removed to form a right interlocking toothed portion 442 that engage when the panel bases 302 of the adjacent profile solar panel tiles 300A, 300B are engaged as shown in FIG. 8.

Figure 16:
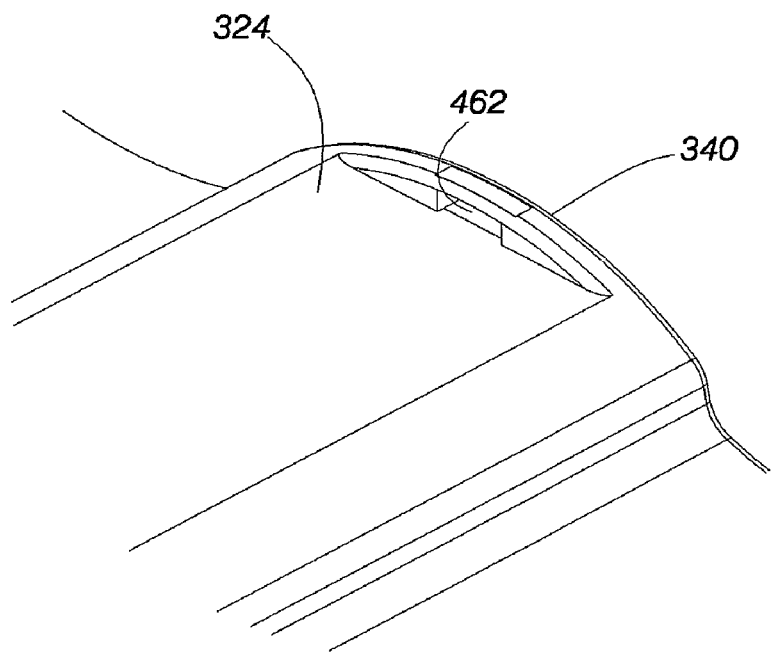
FIG. 16 illustrates an enlarged perspective view of the portion of the panel base of FIG. 9 within the circle 16 in FIG. 15.

The lower wall 430 of the panel support frame 400 includes a plurality of protrusions 450, 452, 454, which are generally rectangular. The protrusions are sized and shaped to engage a respective opening 460, 462, 468 in the crests 304, 306, 308 proximate the respective lower ends of the depressed areas 322, 324, 326, and the lower edge 340 of the panel base 302, as shown in the FIGS. 15 and 16. In preferred embodiments, the portions of the crests around the openings are reinforced with additional material, as shown in FIG. 16. The panel support frame 400 is positioned on the depressed areas 322, 324, 326 with the protrusions 350, 352, 354 engaged in the openings 460, 462, 464. The panel support frame 400 is secured to the panel base 302 by a suitable adhesive, such as, for example, silicon adhesive. In addition, at least one of the crests 304, 306, 308 preferably includes an opening 470 formed in the wall forming the upper boundary of the respective depressed area 322, 324, 326. As shown in FIG. 14, the opening 470 receives a screw 472, which engages the upper wall 432 of the panel support frame 400 to further secure the panel support frame 400 to the base panel 302.

The depressed central portion 426 has a depth of approximately 0.2 inch. The depth is selected to receive the photovoltaic panel 402, which has a corresponding thickness. The depth of the depressed central portion 426 can be varied to accommodate photovoltaic panels having a greater thickness, such as, for example, the photovoltaic panel described below in connection with FIGS. 17, 19 and 20. The photovoltaic panel 402 has a length and width sized to fit in the depressed central portion 426 (e.g., approximately 12.3 inches by approximately 31.7 inches). The photovoltaic panel 402 may have a conventional construction comprising a plurality of cells connected in a selected series-parallel combination to produce a desired output voltage when solar energy is incident on the upper surface of the photovoltaic panel 402. In a particularly preferred embodiment, the photovoltaic panel 402 is constructed in the manner described in FIGS. 18, 19 and 20, described below. The photovoltaic panel 402 is secured in the panel support frame 400 by a suitable weather-resistant adhesive, such as, for example, silicon adhesive.

The photovoltaic panel 402 includes at least a first panel output conductor 480 and a second panel output conductor 482, which exit the panel 402 and pass through one the openings 424 in the panel support frame 400 and then through the opening 380 through the panel 402. The portion of the opening 380 not occupied by the panel output conductors 480, 482 is filed with a suitable weatherproof material, such as, for example, caulking and filler material. The solar array panel assembly 330 is secured to the panel base 300 with a suitable weatherproof adhesive, such as, for example, silicon adhesive.

As further shown in FIGS. 9, 10, 11 and 13, a junction box 500 is positioned on the underside of the panel 402 below the opening 380. The junction box 500 has an opening 502 aligned with the opening 380. The junction box 500 is secured to the panel base 302 by suitable fasteners (e.g., screws), by an adhesive, by plastic welding, or the like. The first panel output conductor 480 and the second panel output conductor 482 from the photovoltaic panel 402 extend into the junction box 500 and are connected respectively to a first external conductor 510 and a second external conductor 512, which exit the junction box 500 via a pair of openings 514, 516. The external conductors 510, 512 are advantageously secured to the openings 514 via a suitable adhesive (e.g., silicon adhesive) or in another suitable manner to provide strain relief for the connections within the junction box 500. After the conductors 480, 482 are connected to the conductors 510, 512, the junction box 500 is sealed with a top 520.

The external conductors 510, 512 have a sufficient size and suitable insulation for exterior use. The ends of the first external conductor 510 and the second external conductor 512 are attached to a respective first polarized connector 530 of a first polarity and a respective second polarized connector 532 of a second polarity. The conductors 510, 512 are connectable to conductors from adjacent solar panels 300 to connect the solar panels 300 in series to form a string of interconnected panels. The solar panels 300 at each end of each string of panels are connected to conductors leading to a control system (not shown) in a central location that receives the electrical outputs from the strings and provides a system power output in a conventional manner.

As discussed above, the photovoltaic panel 160 in the S-tile solar panel 100 of FIGS. 1-6 and the photovoltaic panel 402 of FIGS. 7-15 may be conventional photovoltaic panels configured to have the dimensions described above. In preferred embodiments, the photovoltaic panels 160 and 402 are constructed in accordance with a photovoltaic panel 600 illustrated in FIGS. 18, 19 and 20.

Figure 18:
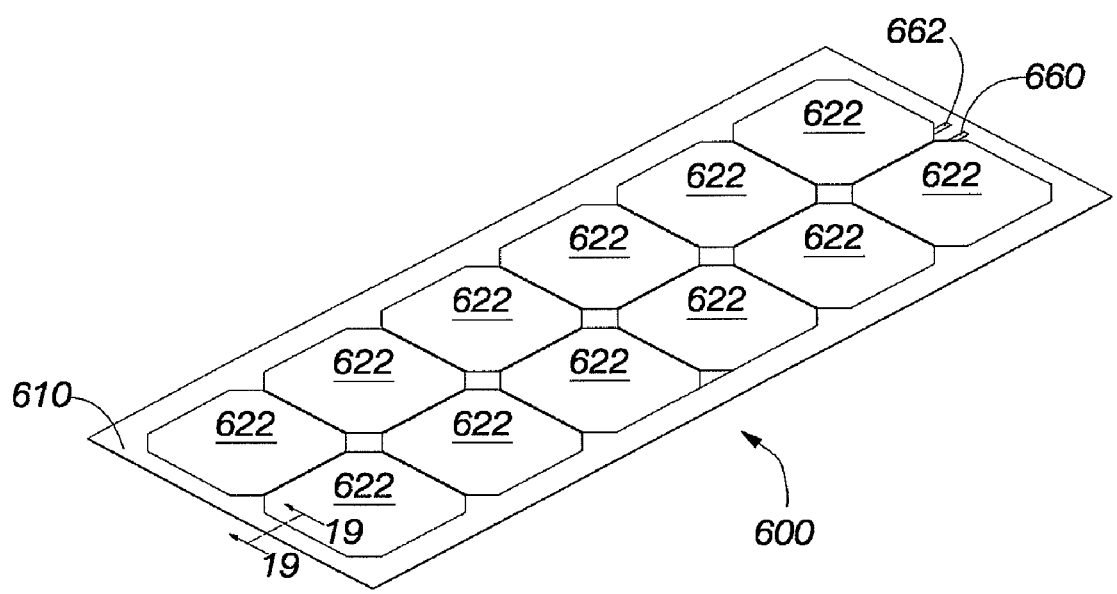
FIG. 18 illustrates a perspective view of an embodiment of a photovoltaic panel advantageously incorporated into the solar panel tile of FIGS. 1-6 and the solar panel tile of FIGS. 7-17.
Figure 19:
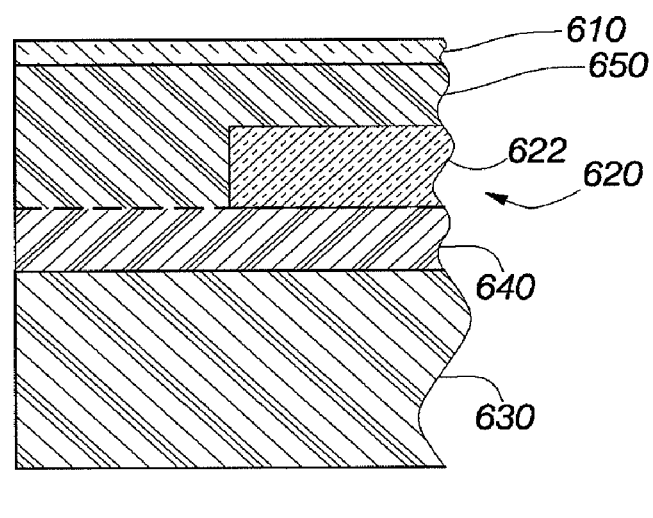
FIG. 19 illustrates an enlarged cross-sectional view of the photovoltaic panel of FIG. 18 taken along the lines 19-19 in FIG. 18.
Figure 20:
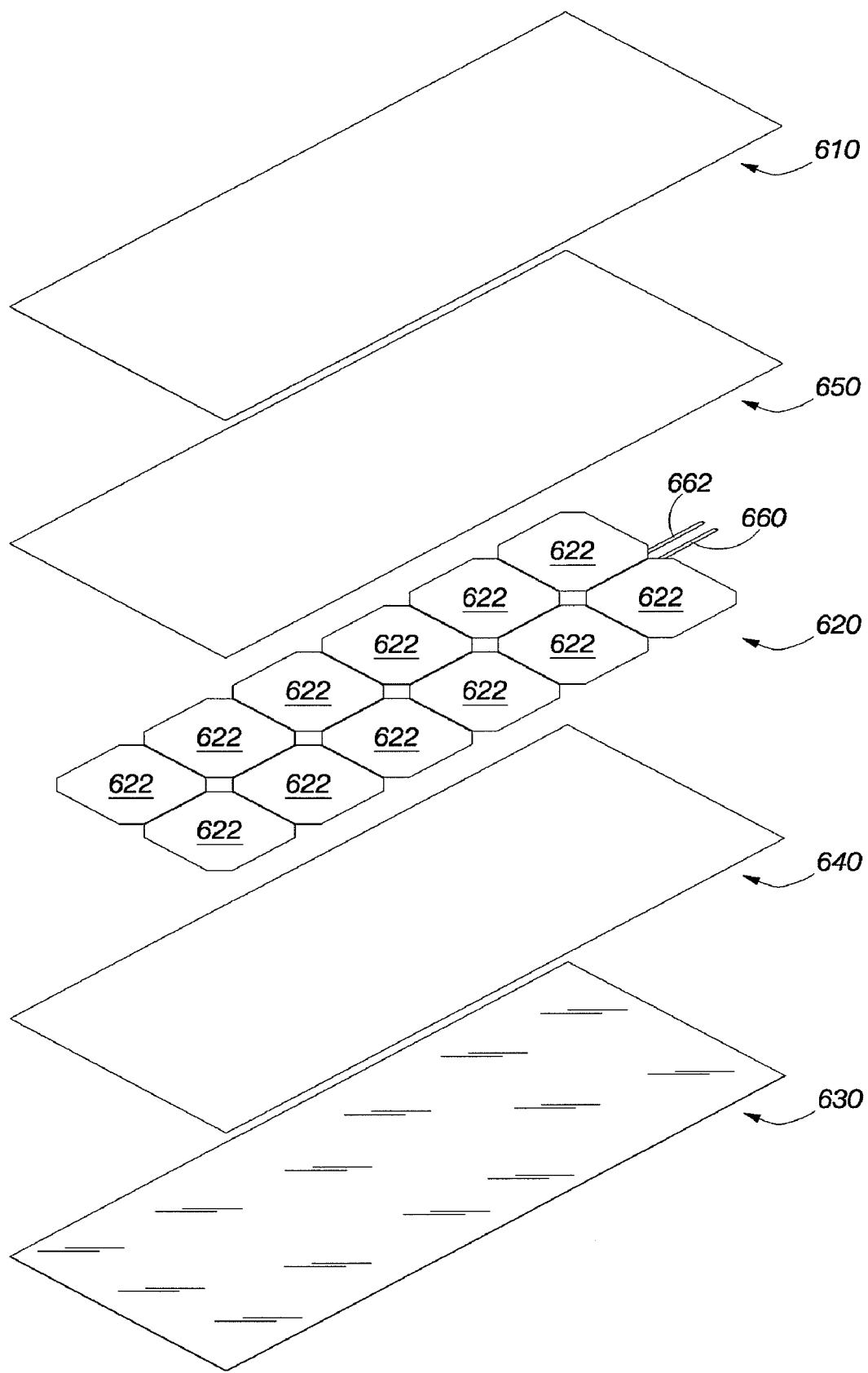
FIG. 20 illustrates an exploded perspective view of the photovoltaic panel of FIG. 17.

As illustrated in FIGS. 18, 19 and 20, a laminated photovoltaic panel 600 is configured as a generally rectangular panel, which is sized and shaped to fit in the depressed central portion 426 of the panel support frame 400. Thus, the panel 600 can be handled by a construction crew without requiring any special material handling equipment. In the illustrated embodiment, the panel 600 has dimensions of approximately and has a thickness of less than approximately 0.2 inch to fit within the depth of the depressed central portion 426.

The panel 600 has a transparent upper protective layer 610 that faces upward and is exposed to the sun. A middle layer 620 is positioned beneath the upper protective layer 610. The middle layer 620 comprises a plurality of photovoltaic cells 622 electrically interconnected to form an photovoltaic array. The middle layer 620 rests on a rigid lower layer 630. The middle layer 620 is secured to the rigid lower layer 630 by a lower adhesive layer 640. The middle layer 620 is secured to the upper protective layer 610 by an upper adhesive layer 650. The middle layer 620 is thus encapsulated between the lower adhesive layer 640 and the upper adhesive layer 650.

The upper protective layer 610 provides impact protection as well as weather protection to the panel 600. The upper protective layer 610 advantageously comprises DuPont™ Teflon™ fluorinated ethylene propylene (FEP) resin, which is formed into a film layer of suitable thickness (e.g., approximately 0.1 inch). Thus, the photovoltaic cells 622 in the middle layer 620 are exposed to direct sunlight without being exposed to moisture and other climatic conditions and without being exposed to direct impact by feet, falling objects, and debris. Tempered glass having a suitable thickness may also be used as the upper protective layer 610.

In the illustrated embodiment, the rigid lower layer 630 comprises fiber reinforced plastic (FRP). For example, the FRP layer advantageously comprises a polyester resin with embedded stranded glass fibers. In one advantageous embodiment, the FRP layer has a thickness of approximately 0.079 inch. The rigid lower layer of FRP provides an advantageous combination of rigidity, light weight, very low permeability, and flatness Preferably, the lower adhesive layer 640 is provided as a thin film that is positioned on the upper surface of the rigid lower layer 630. The array of photovoltaic cells 622 in the middle layer 620 is then positioned on the lower adhesive layer 640. In the illustrated embodiment, the lower adhesive layer 640 advantageously comprises a transparent adhesive, such as, for example, ethylene-vinyl-acetate (EVA). EVA is a transparent, heat-activated adhesive that is particularly suitable for securing the cells. Other suitable adhesives, such as, for example, polyvinylbuterol (PVB), or other pottant materials, can be substituted for the EVA.

After positioning the array of photovoltaic cells 622 on the lower adhesive layer 640, the upper transparent adhesive layer 650 is placed over the middle layer 620 so that the photovoltaic cells 622 are sandwiched between the two transparent adhesive layers. The upper adhesive layer 650 should match the physical characteristics of the lower adhesive layer. In the illustrated embodiment, both the upper adhesive layer 650 and the lower adhesive layer 640 comprise EVA, but other suitable transparent adhesives can be substituted for the EVA. The transparent upper protective layer 610 is then positioned over the upper transparent adhesive layer 650 to complete the laminated structure shown in an enlarged partial cross section in FIG. 19.

The EVA material and the use of the EVA material to bind the layers of a laminated photovoltaic cell are described, for example, in U.S. Pat. No. 4,499,658 to Lewis. In addition to acting as a binder to secure the photovoltaic cells 622 between the upper protective layer 610 and the lower rigid layer 630, the upper EVA layer 650 and the lower EVA layer 640 also act as a cushion between the two outer layers.

The photovoltaic cells 622 are electrically interconnected in a series-parallel configuration in a conventional manner to provide a suitable output voltage. For example, in the illustrated embodiment, 12 photovoltaic cells 622 are arranged in 2 rows of 6 cells each. The photovoltaic panel 600 is illustrated with two flat ribbon electrical conductors 660, 662 extending from right side of the middle layer 620. The two conductors 660, 662 correspond to the two conductors 480, 482 in FIGS. 10 and 13. In the illustrated embodiment, the two electrical conductors 660, 662 are bent and are passed through openings (not shown) in the rigid lower layer 630. Thus, the free ends of the two conductors 660, 662 are exposed beneath the rigid lower layer 630 for interconnection to the external conductors 510, 512 within the junction box 500, as described above.

The upper protective layer 610, the middle layer 620, the lower layer 660, and the two adhesive layers 640 and 650 are stacked in the order shown in FIGS. 19 and 20 and are aligned to form the sandwich structure shown in FIGS. 18 and 19. The free end of each of the two panel output conductors 660, 662 are covered with a temporary covering (e.g., a cloth tube, or the like) during the lamination process. The structure is permanently laminated in a known manner using heat and pressure. In one advantageous embodiment, the structure is laminated in a vacuum laminator in the manner described, for example, in U.S. Patent Application Publication No. 2005/0178248 A1 to Laaly et al. In particular, the structure is first subjected to a vacuum to remove any trapped gas bubbles in the EVA adhesives. The structure is then subjected to high pressure to force the layers together as tightly as practical. The structure is then heated to a suitable temperature (e.g., approximately 160 degrees C.) to cure the adhesives in the layers 640 and 650 and thereby permanently bond the adjacent layers. In the illustrated embodiment, the upper layer 610 and the two transparent adhesive layers 640, 650 secure the panel output conductors 660, 662 to the top of the middle layer 620. Preferably, the panel output conductors 660, 662 extend from the bottom of the middle layer 620 and pass through one or more openings (not shown) in the rigid lower layer 630. The opening through the bottom layer 630 is sealed during the lamination process.

The laminated structure is held at the high temperature for a sufficient time to cure the upper transparent adhesive layer 650 and the lower transparent adhesive layer 640 and to cause the two transparent adhesive layers to adhere together to become a combined layer that completely encapsulates the photovoltaic cells 622. The high temperature also causes the upper transparent layer 610 to soften and flow to provide the protective upper coating described above. The laminated structure is then allowed to cool to ambient temperature.

After the lamination process is completed, the panel 600 is positioned in the panel support frame 400 (FIGS. 7-16) with the two panel conductors 660, 662 extending below the bottom 422 of the panel support frame. The two conductors 660, 662 are passed through the hole 380 in the panel base 302 and through the opening 502 in the junction box 500, as shown for the two conductors 480, 482 in FIG. 13. The panel 600 is secured to the panel support frame 400 using a suitable adhesive, as described above. The temporary coverings over the two panel output conductors 660, 662 are removed, and the two panel output conductors 660, 662 are electrically connected within the junction box 500 to the two weather-resistant external conductors 510, 512 using conventional interconnection devices. The removable top 520 of the junction box 500 is then secured over the conductor interconnection devices to provide a weather-resistant seal. The panel support frame 400 is secured to the panel base 302 in the manner described above.

FIGS. 21-24 illustrated a third embodiment of a profile solar panel tile 800 having a modified tile base 802, a modified panel support frame 804 and a modified photovoltaic panel 806. In particular, the photovoltaic panel 806 includes an output module 810 that comprises a junction box that is attached to the laminated photovoltaic panel 806 after the photovoltaic panel 806 is installed in the panel support frame 806, as described below. For example, the output module 810 may be secured to the photovoltaic panel 806 with a suitable adhesive. The output module (junction box) 810 may be pre-wired with a first weather-resistant electrical conductor 812 and a second weather-resistant electrical conductor 814, which are coupled to a first polarized connector 816 and a second oppositely polarized connector 818, respectively. Alternatively, the weather-resistant electrical conductors 812, 814 may be inserted into the output module 810 after the output module is attached to the photovoltaic panel. The external electrical conductors 812, 814 are electrically connected (e.g., by welding) to the panel output conductors 660, 662 (shown in FIGS. 18 and 20) within the output module 810, and the output module is sealed. The tile base 802 and the panel support frame 804 are configured to be constructed of injection-molded plastic, as discussed above. The photovoltaic panel 806 is preferably constructed as described above in connection with FIGS. 18-20.

Figure 21:
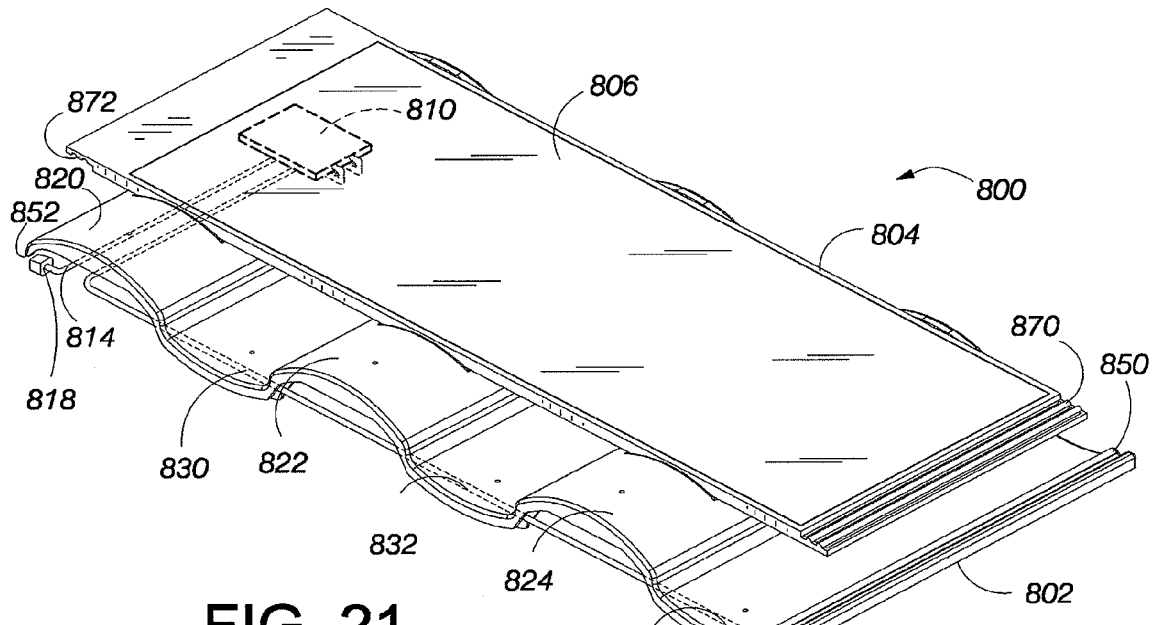
FIG. 21 illustrates a perspective view generally looking at the top of a third embodiment of a profile solar panel tile configured for injection molding and having a photovoltaic panel with an output module pre-wired with weather-resistant external conductors.
Figure 22:
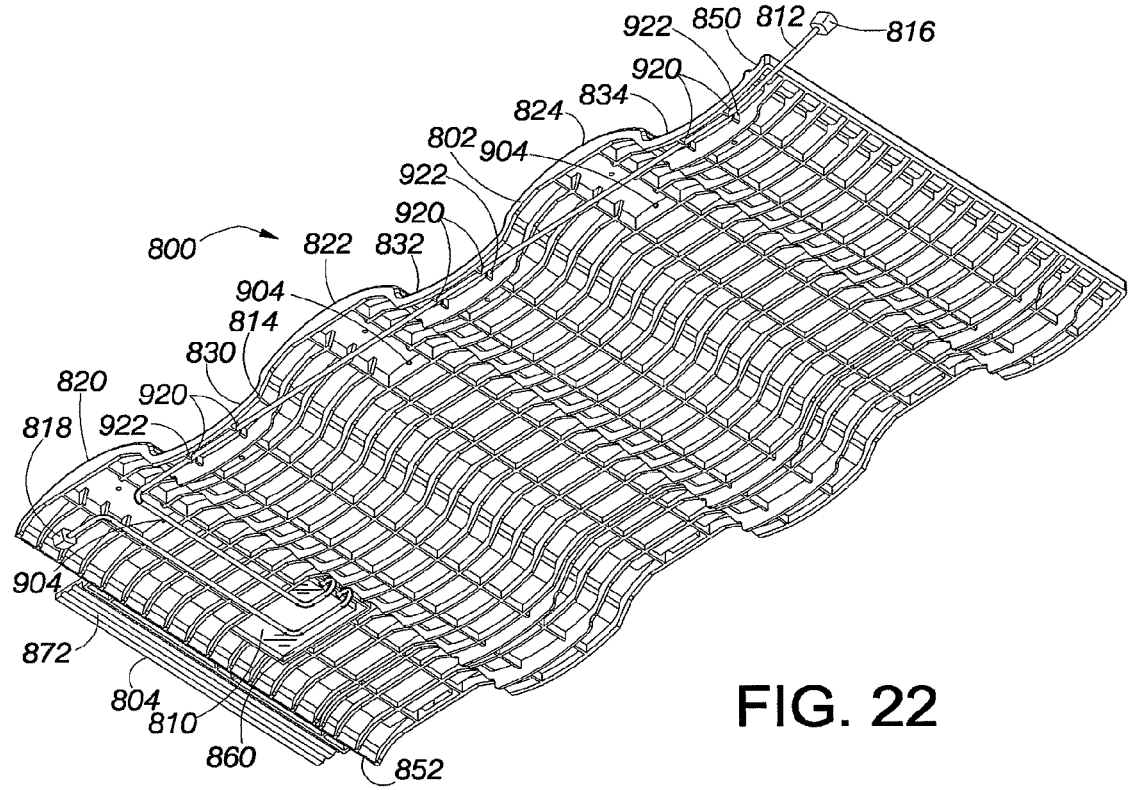
FIG. 22 illustrates a perspective view generally looking at the bottom of the third embodiment of the profile solar panel tile of FIG. 21.
Figure 23:
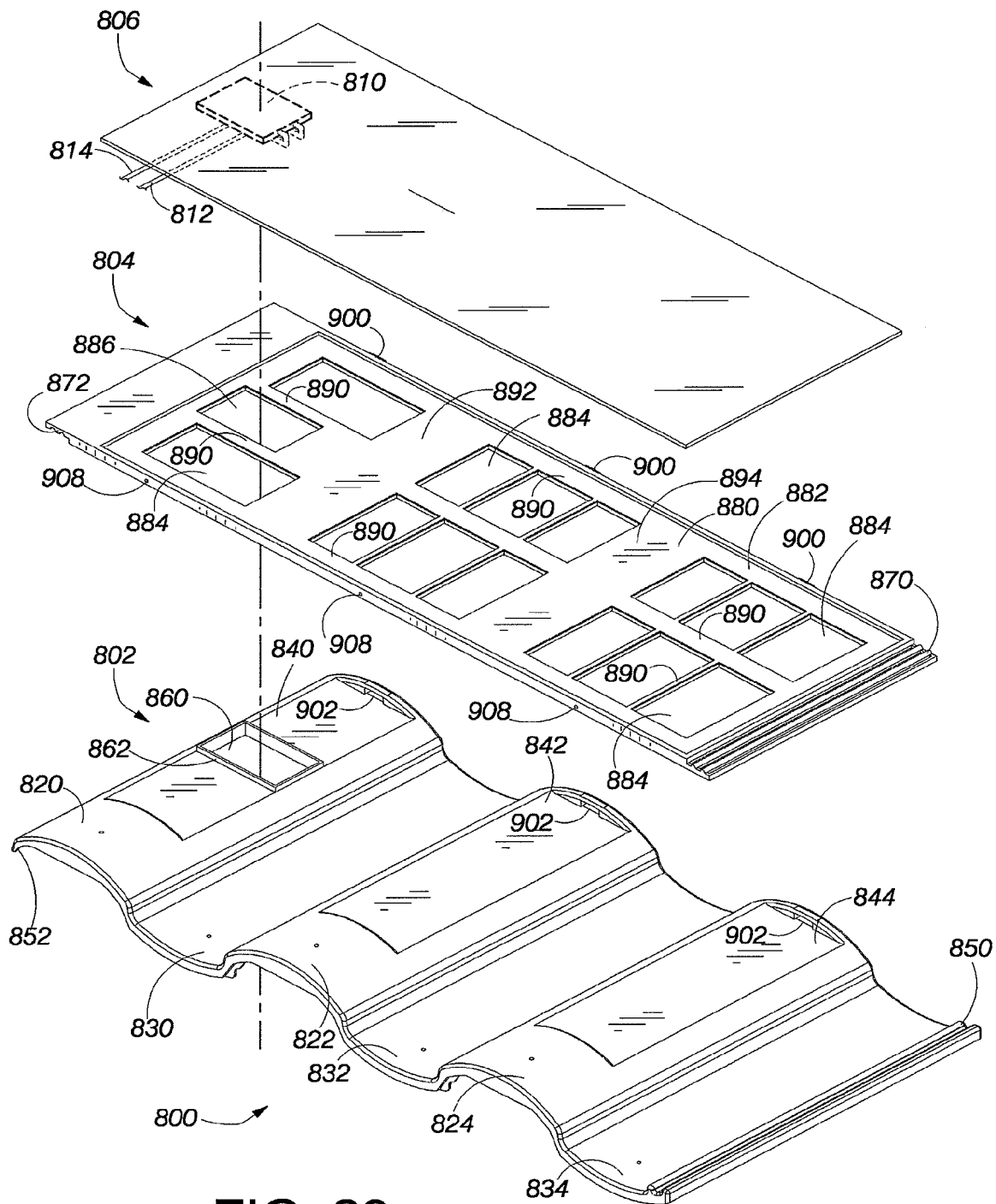
FIG. 23 illustrates an exploded perspective view of the profile solar panel tile of FIG. 21 looking from the top of the assembly showing the tile base, the panel support frame, the photovoltaic panel and the opening in the tile base to receive the output module on the photovoltaic panel.
Figure 24:
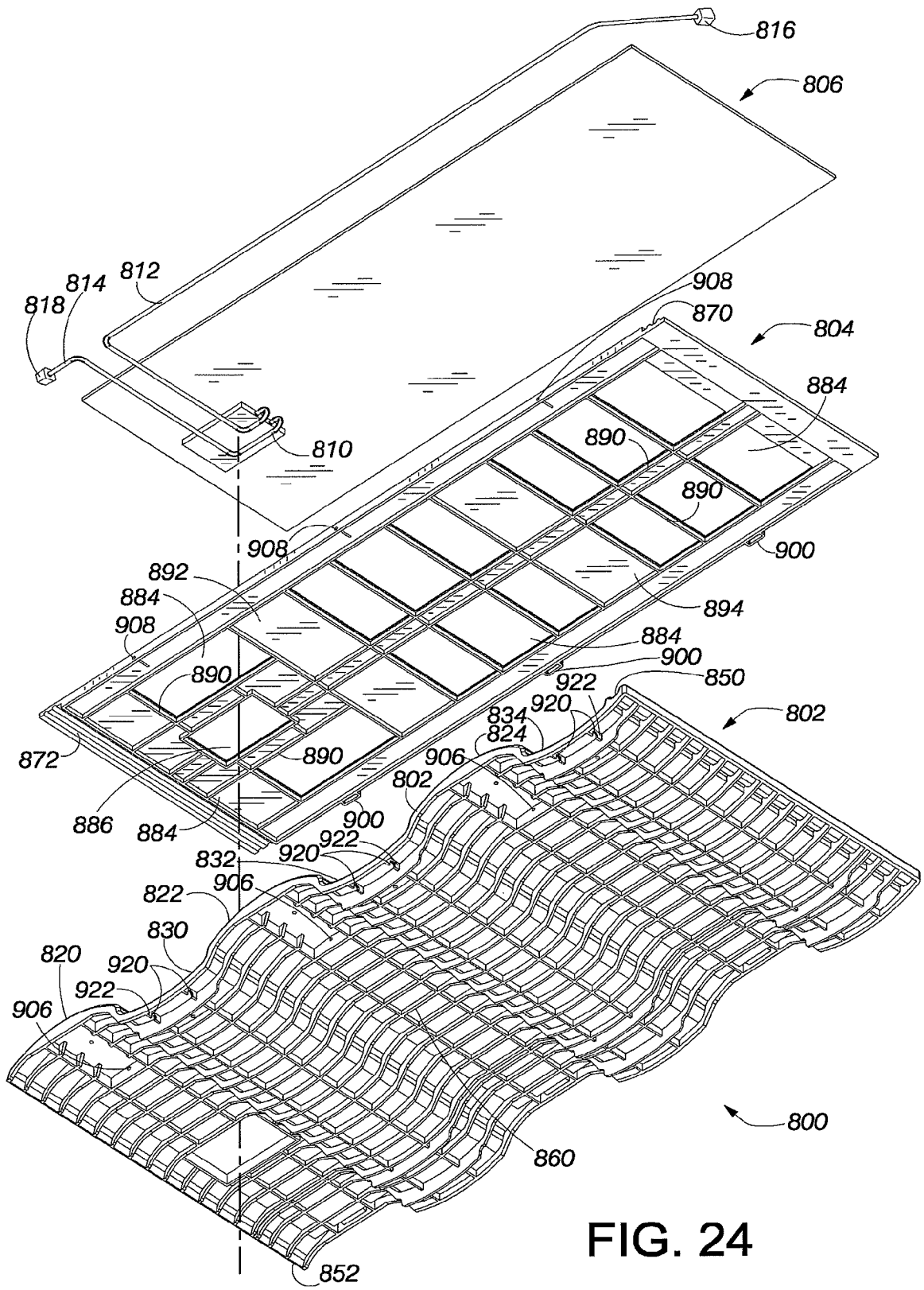
FIG. 24 illustrates an exploded perspective view of the profile solar panel tile of FIG. 21 looking from the bottom of the assembly.

FIG. 21 illustrates a perspective view generally looking at the top of the profile solar panel tile 800 when fully assembled and ready for installation on a roof. FIG. 22 illustrates a perspective view of the assembled profile solar panel tile 800 generally looking at the bottom of the tile base 802. FIG. 23 illustrates an exploded perspective view of the profile solar panel tile 800 looking from the top of the assembly to show addition details of the tile base 802, the panel support frame 804 and the photovoltaic panel 806. FIG. 24 illustrates an exploded perspective view of the profile solar panel tile 800 looking from the bottom of the tile base 802.

The profile solar panel tile 800 is similar to the previously described embodiments. The tile base 802 has the size and shape of a conventional profile roofing tile. In particular, the tile base 802 includes three crests 820, 822, 824 and three pans 830, 832, 834. As shown in FIG. 23, a portion of each crest 820, 822, 824 is flattened to form a respective flat depressed area 840, 842, 844. The flat depressed areas 840, 842, 844 are sized to receive the panel support frame 804, as discussed above. The tile base 802 includes a left tile interlock 850 and a right tile interlock 852 corresponding to the interlocks described above with respect to the embodiment of FIGS. 7-17.

Unlike the previously described embodiment, the right crest 820 of the tile base 802 has a generally rectangular opening 860 proximate to the upper boundary of the depressed area 840, as shown in FIG. 23. In the illustrated embodiment, the rectangular opening 860 is positioned approximately in the middle of the depressed area 840 between the upper and lower boundaries of the depressed area. The rectangular opening has a has a length across the depressed area of approximately 4.1 inches and has a width in the direction from the lower boundary to the upper boundary of the depressed area of approximately 2.45 inches. The rectangular opening 860 passes entirely through the thickness of the tile base 802. The rectangular opening is surrounded by a raised perimeter wall 862 formed on the depressed area 842. Accordingly, any water that may reach the depressed area 842 is blocked from entering the rectangular opening 860 by the perimeter wall 862. In the illustrated embodiment, the perimeter wall 862 has a height of approximately 0.25 inch and has a thickness of approximately 0.1 inch.

The panel support frame 804 is similar to the previously described panel support frames and has external dimensions sized to fit in the depressed areas 840, 842, 844 of the tile base 802. The panel support frame 804 includes a left interlock 870 and a right interlock 872 that correspond to the interlocks of the panel support frame of the embodiment of FIGS. 7-17. The panel support frame 804 extends horizontally for a sufficient distance that the left interlock 870 of the panel support frame 804 engages a right interlock 872 of an adjacent panel support frame (not shown) as described above.

The panel support frame 804 includes a depressed central portion 880 that has a size, shape and depth selected to receive the photovoltaic panel 806 as described above for the embodiment of FIGS. 7-17. The depressed central portion 880 includes a lower surface 882 having portions removed to form a plurality of openings 884. The openings 884 reduce the quantity of plastic required to manufacture the panel support frame 804 and thus reduce the mass and the cost of the panel support frame. In the illustrated embodiment, the openings 884 are generally rectangular; however, the openings can be formed in other shapes. One of the openings 884, designated as an opening 886 in FIGS. 23 and 24, is sized and shaped to fit around the raised perimeter wall 862 when the panel support frame 804 is positioned on the tile base 802.

As further shown in FIGS. 23 and 24, the openings 884 have a generally regular pattern surrounded by relatively small remaining portions 890 of the lower surface 882 of the depressed central portion 880. The remaining portions 890 provide structural stability for the panel support frame 804 and also provide support for the photovoltaic panel 806. An adhesive may be applied to the remaining portions to secure the photovoltaic panel 806 to the panel support frame 804.

The generally regular pattern of the openings 884 is interrupted at a first shield portion 892 and a second shield portion 894 where the lower surface 882 of the depressed central portion 880 is not removed to form an opening. When the panel support frame 804 is positioned on the tile base 802, the first shield portion 892 is positioned over the first pan 830, and the second shield portion 894 is positioned over the second pan 832. When the solar panel tile 800 is installed on a roof, wind blowing upward along the roof in the pans 830, 832 may have a tendency to push against the lower surface of the photovoltaic panel 806 exposed through the openings 884 in the lower surface 882 of the panel support frame 804. The two shield portions 894, 896 advantageously partially block the wind from pushing against the photovoltaic panel 806 and possibly dislodging the photovoltaic panel 806 from the panel support frame 804. In addition, the shield portions 894, 896 provide additional surfaces for the adhesive used to secure the photovoltaic panel 806 to the panel support frame 804. In the illustrated embodiment, the shield portions 894, 896 cover only a portion of the underlying pans 830, 832.

As further illustrated in FIGS. 21-24, the photovoltaic panel 806 includes the output module (junction box) 810, which is attached to the lower surface of the photovoltaic panel 806 after the photovoltaic panel 806 is secured to the panel support frame 804, as described above. The output module 810 is located at a location corresponding to the location of the opening 886 in the panel support frame 804. Rather than connecting the weather-resistant electrical conductors 812, 814 to the fragile panel conductors (shown in FIGS. 18 and 20) of the photovoltaic panel when the solar panel tile 800 is assembled, the conductors 812, 814 are advantageously connected to the fragile panel conductors after installing the photovoltaic panel 806 into the panel support frame 804. After the weather-resistant conductors 812, 814 are electrically connected (e.g., welded) to the fragile panel conductors within the junction box, the conductors and the connections may be covered with a potting compound. If used, the potting compound is advantageously formed in the generally rectangular shape of the output module 810 shown in FIGS. 21-24. For example, the potting compound may be injected into the junction box to encapsulate the conductors and the connections. The potting compound provides additional protection of the connections and the fragile conductors from the weather. In addition, the potting compound provides strain relief to inhibit movement of the weather-resistant conductors 812, 814 from breaking the connections or breaking the fragile panel conductors.

As discussed above, the photovoltaic panel 806 is advantageously secured to the panel support frame 804 using a suitable weather-resistant adhesive between the bottom surface of the photovoltaic panel and the unremoved portions of the lower surface 882 of the depressed central portion 880 of the panel support frame. In addition, gaps between the edges of the photovoltaic panel 806 and the perimeter walls of the depressed central portion of the panel support frame is filled with a suitable weather-resistant sealant material, which further secures the photovoltaic panel in the panel support frame and which seals the edges of the photovoltaic panel.

The panel support frame 804 is positioned on the tile base 802 by engaging a plurality of tabs 900 on the panel support frame 804 into corresponding plurality of openings 902 at the lower boundaries of the depressed areas 840, 842, 844 of the tile base 802. The panel support frame 804 is secured to the tile base 804 by a plurality of fasteners 904 (e.g., screws) positioned through a plurality of holes 906 in the tile base to engage a plurality of holes 908 in the panel support frame 804.

After installing the photovoltaic panel 806 and the support frame 804 onto the tile base 802, the weather-resistant conductors 812, 814 are positioned in a plurality of notches 920 formed in selected ribs 922 underneath the tile base 802. In the illustrated embodiment, the conductor 812 and the associated connector 816 extend beyond the left edge of the tile base 802. The conductor 814 and the associated connector 818 extend only to an open volume formed beneath the right crest 820. When two solar panel tiles 800 are positioned on a roof and interlocked, the connector 816 from the tile on the right and the connector 818 from tile on the left are interconnected in the volume beneath the right crest 820 of the tile on the left so that the connection between the two connectors is protected from the weather by the tile base 802.

In accordance with the embodiments disclosed herein, an aesthetically pleasing roofing module combines the weather protection features and appearance of a conventional clay or concrete S-tile with the electrical energy generating capabilities of a solar cell sandwich. The roofing module are easily installed with conventional clay or concrete roofing S-tiles to include electrical energy generation capability on newly constructed roofs and can replace conventional clay or concerted roofing S-tiles to add electrical energy generation capability to existing roofs.

The present invention is disclosed herein in terms of a preferred embodiment thereof, which provides a photovoltaic panel integrated into an S-tile roofing module as defined in the appended claims. Various changes, modifications, and alterations in the teachings of the present invention may be contemplated by those skilled in the art without departing from the intended spirit and scope of the appended claims. It is intended that the present invention encompass such changes and modifications.

What is claimed is:

1. A roofing module that provides weather protection and that generates electrical power, comprising:
   a base comprising a plurality of raised crests and lowered pans between a first edge and a second edge of the base, the crests and the pans having contours sized and shaped to match the size and shape of the contours and pans of conventional contour roofing tiles to enable the base to engage with the conventional contour roofing tiles, the base comprising a lightweight plastic material, each crest of the base including a depressed portion, the depressed portion of at least one crest having an opening from a top surface to a bottom surface of the at least one crest; and
   a photovoltaic panel assembly positioned in the depressed portions of at least two adjacent crests and spanning between a first edge and a second edge of the panel assembly across at least one pan between the at least two adjacent crests of the base, wherein the photovoltaic panel assembly comprises:
      an outer frame sized to fit in the depressed portions of the base, the outer frame encompassing a depressed inner area:
      a photovoltaic array sized to fit in the depressed inner area of the outer frame, the photovoltaic array having an output module with a first electrical output conductor and a second electrical output conductor extending therefrom, the output module sized to fit in the opening of the at least one crest of the base so that the first and second electrical output conductors extend below the bottom surface of the at least one crest:
      a first interlock at the first edge of the photovoltaic panel assembly and a second interlock at the second edge of the photovoltaic panel assembly, the first interlock and the second interlock having mutually engaging configurations such that when two adjacent bases are engaged, the first interlock of the panel on one base engages the second interlock of the panel on the other base,
      wherein the depressed inner area of the outer frame of the photovoltaic panel assembly comprises a lower surface comprising a support structure surrounding a plurality of openings in the lower surface, and
      wherein the support structure comprises a plurality of shield portions respectively disposed above the lowered pans of the base.

2. A method of constructing a roofing tile having an integrated photovoltaic array, comprising:
   constructing a photovoltaic assembly, comprising:
      installing a photovoltaic array in a frame having a central depressed portion sized to receive the photovoltaic array, the frame spanning between a first edge and a second edge of the frame, the first edge of the frame including a first interlock configuration and the second edge of the frame including a second interlock configuration, the photovoltaic array including an output module and at least a pair of electrical conductors extending from the output module; and
      securing the photovoltaic array to the frame with the output module extending through an opening in the frame; and
   installing the photovoltaic assembly in a base having a plurality of raised crests and interposed lowered pans between a first edge and a second edge of the base, the crests and pans shaped to match the shapes of a conventional contour roofing tile, comprising:
      positioning the photovoltaic assembly on at least first and second depressed portions of at least two adjacent crests and spanning at least one pan between the two adjacent crests, with the first edge of the photovoltaic assembly overhanging a pan at the first edge of the base and with the second edge of the photovoltaic assembly extending beyond a crest at the second edge of the base, at least one of the crests having an opening sized to receive the output module of the photovoltaic array such that the pair of electrical conductors extend below the crest; and
      securing the photovoltaic assembly to the base, wherein the depressed inner area of the frame of the photovoltaic assembly comprises a lower surface comprising a support structure surrounding a plurality of openings in the lower surface, and wherein the support structure comprises a plurality of shield portions respectively disposed above the lowered pans of the base.

3. A roofing module that provides weather protection and that generates electrical power, comprising:

a base comprising a plurality of raised crests and lowered pans between a first edge and a second edge of the base, the crests and pans having contours sized and shaped to match the size and shape of the contours and pans of conventional contour roofing tiles to enable the base to engage with the conventional contour roofing tiles, the base comprising a lightweight plastic material, each crest of the base including a depressed portion, the depressed portion of at least one of the crests including an opening surrounded by a perimeter wall raised above the depressed portion;

a photovoltaic panel support frame positioned in the depressed portions of at least two adjacent crests of the base and spanning between a first edge and a second edge of the panel support frame across at least one pan between the at least two adjacent crests, the panel support frame comprising an outer wall sized to fit in the depressed portion of the base, the support panel including a depressed portion having a lower surface, the lower surface including at least one opening sized and positioned to surround the perimeter wall of the opening in the base when the panel support frame is positioned in the depressed portion of the base, the first edge of the panel support frame including a first interlock and the second edge of the panel support frame including a second interlock, the first interlock and the second interlock having mutually engaging configurations such that when two adjacent bases are engaged, the first interlock of the panel support frame on one base engages the second interlock of the panel support frame on the other base; and a photovoltaic panel sized to fit in the depressed portion of the support frame, the photovoltaic panel having a lower surface and an output module formed on the lower surface, the output module sized and positioned to fit within the opening in the base when the photovoltaic panel is positioned in the depressed portion of the panel support frame and the panel support frame is positioned in the depressed portion of the base.

4. A profiled solar roof module, comprising:

a base having (i) a left side and a right side, (ii) a top edge and a bottom edge, and (iii) a plurality of alternating crests and valleys undulating from the left side to the right side;

each crest having a substantially flat area disposed therein, the flat area dividing the corresponding crest into two crest portions with no crest therebetween, each flat area being closer to the base bottom edge than to the base top edge, a portion of said each crest being disposed between said base bottom edge and said each flat area, each of the plurality of crests having the same shape; and a solar panel being disposed in the flat areas of the plurality of crests, an upper surface of said solar panel being even with a peak of each of the crests, said solar panel having (i) top and bottom edges in respective contact with base flat area top and bottom edges, and (ii) left and right side edges not in contact with said base.

5. A module according to claim 4, wherein each crest has a crest width at the top edge that is different than the crest width at the bottom edge.

6. A module according to claim 4, wherein the base has a width between the left edge and the right edge that is greater than a corresponding width of the solar panel.

7. A module according to claim 4, further comprising a junction box disposed adjacent a bottom surface of a base crest.

8. A module according to claim 4, further comprising left side base interlock structure and right side base interlock structure, these interlock structures being configured to engage each other.

9. A module according to claim 8, wherein one of the side interlock structures is configured to overlap the other to shield the interlock structures from water.

10. A module according to claim 8, further comprising left side solar panel interlock structure and right side solar panel interlock structure, these interlock structures being configured to engage each other.

11. A module according to claim 4, wherein a solar panel lower edge has a plurality of protrusions configured to engage complementary recesses in the corresponding base flat areas.

12. A module according to claim 4, wherein each valley has a fastener hole therein.

13. A profiled solar roof module base, comprising:

a base structure having (i) a left side and a right side, (ii) a top edge and a bottom edge, and (iii) a plurality of alternating crests and valleys undulating from the left side to the right side;

each crest having a substantially flat area disposed therein, the flat area dividing the corresponding crest into two crest portions with no crest therebetween, each flat area being closer to the base bottom edge than to the base top edge; and a solar module supported on said flat area, a portion of said each crest being disposed between said base bottom edge and said each flat area, said portion having a height even with a thickness of the solar module supported on said flat area, each of the plurality of crests having the same shape, said solar module having (i) top and bottom edges in respective contact with base structure flat area top and bottom edges, and (ii) left and right side edges not in contact with said base structure.

14. A module base according to claim 13, further comprising an electrical connector opening in the flat area of at least one of the crests.

15. A module base according to claim 14, further comprising an engagement hole in a vertically-disposed wall of a crest adjacent the flat area.

16. A module base according to claim 13, further comprising a plurality of ribs disposed on a bottom surface of said base.

17. A module base according to claim 13, further comprising left side base interlock structure and right side base interlock structure, these interlock structures being configured to engage each other.

18. A support structure adapted to support a solar panel on a profiled solar roof module that has a plurality of alternating crests and valleys, said support structure, comprising:

a rectangular support structure having a periphery and a depressed central area within said periphery is configured to support the solar panel;

a plurality of openings being disposed within said depressed area, one opening in said depressed area being configured for passage of electrical connectors; and a plurality of shields disposed between said openings, each shield being configured to block substantially all of a respective valley portion of an underlying profiled solar roof module.

19. A support structure according to claim 18, further comprising left side interlock structure and right side interlock structure, these interlock structures being configured to engage each other.

20. A support structure according to claim 18, wherein said openings are disposed in a matrix pattern.

* * * * *